United States Patent
Zhou et al.

(10) Patent No.: US 11,044,018 B1
(45) Date of Patent: Jun. 22, 2021

(54) OPTICAL MODULATOR AND METHODS OF MAKING AND USING THE SAME

(71) Applicant: Source Photonics, Inc., West Hills, CA (US)

(72) Inventors: Qiugui Zhou, West Hills, CA (US); Mark Heimbuch, West Hills, CA (US)

(73) Assignee: Source Photonics, Inc., West Hills (CA)

( * ) Notice: Subject to any disclaimer, the term of this patent is extended or adjusted under 35 U.S.C. 154(b) by 583 days.

(21) Appl. No.: 16/076,645

(22) PCT Filed: Jul. 23, 2018

(86) PCT No.: PCT/US2018/043346
§ 371 (c)(1),
(2) Date: Aug. 8, 2018

(87) PCT Pub. No.: WO2020/023016
PCT Pub. Date: Jan. 30, 2020

(51) Int. Cl.
*H04B 10/548* (2013.01)
*H04B 10/50* (2013.01)
(52) U.S. Cl.
CPC ....... *H04B 10/548* (2013.01); *H04B 10/5051* (2013.01)
(58) Field of Classification Search
CPC .......................... H04B 10/548; H04B 10/5051
See application file for complete search history.

(56) References Cited

U.S. PATENT DOCUMENTS

| | | | | |
|---|---|---|---|---|
| 5,959,753 A | * | 9/1999 | Duling, III | H04B 10/25077 398/155 |
| 6,262,834 B1 | * | 7/2001 | Nichols | G02F 1/225 359/301 |
| 6,473,541 B1 | * | 10/2002 | Ho | B82Y 20/00 385/15 |
| 7,515,778 B2 | * | 4/2009 | Mosinskis | G02F 1/0121 385/2 |
| 8,885,679 B1 | * | 11/2014 | Roth | H01S 5/06246 372/29.011 |

(Continued)

OTHER PUBLICATIONS

International Preliminary Report on Patentability dated Feb. 4, 2021; International Patent Application No. PCT/US2018/043346; 7 pgs.; International Bureau of WIPO, Geneva, Switzerland.

(Continued)

*Primary Examiner* — Tanya T Motsinger
(74) *Attorney, Agent, or Firm* — Andrew D. Fortney; Central California IP Group, P.C.

(57) ABSTRACT

Embodiments of the disclosure pertain to an optical modulator including an m*n optical coupler, first and second waveguides coupled or connected to the m*n optical coupler, a first phase shifter coupled to the first waveguide, and first and second loop mirrors at respective ends of the first and second waveguides opposite from the m*n optical coupler. The m*n optical coupler is configured to combine substantially similar or identical continuous light beams (at least one of which may be phase-shifted) returned through the first and second waveguides by the first and second loop mirrors to form a modulated optical signal. A compound optical modulator, a modulated or modulatable laser, and methods of using and manufacturing the optical modulators, are also disclosed.

20 Claims, 8 Drawing Sheets

(56) References Cited

U.S. PATENT DOCUMENTS

| | | | | |
|---|---|---|---|---|
| 9,575,256 | B2* | 2/2017 | Li | G02B 6/29352 |
| 2005/0135733 | A1* | 6/2005 | Reid | G02B 6/4246 |
| | | | | 385/15 |
| 2008/0193124 | A1* | 8/2008 | Atieh | H04Q 11/0005 |
| | | | | 398/3 |
| 2009/0310900 | A1* | 12/2009 | Sakamoto | G02F 1/2255 |
| | | | | 385/3 |
| 2010/0231817 | A1* | 9/2010 | Ide | G02F 1/13471 |
| | | | | 349/18 |
| 2013/0044974 | A1* | 2/2013 | Doerr | G02F 1/225 |
| | | | | 385/3 |
| 2015/0016767 | A1* | 1/2015 | Akiyama | G02F 1/225 |
| | | | | 385/3 |
| 2016/0248217 | A1* | 8/2016 | Fermann | H01S 3/107 |
| 2016/0334648 | A1* | 11/2016 | Lu | G02F 1/2257 |
| 2017/0293083 | A1* | 10/2017 | Menard | G02F 1/225 |
| 2018/0205465 | A1* | 7/2018 | Tanaka | G02F 1/025 |
| 2019/0089132 | A1* | 3/2019 | Soda | H01S 5/141 |
| 2019/0293870 | A1* | 9/2019 | Nebendahl | G02B 6/29338 |
| 2020/0014167 | A1* | 1/2020 | Rolland | H01S 3/1307 |

OTHER PUBLICATIONS

Antoine Frappe et al.; "An All-Digital RF Signal Generator Using High-Speed Delta-Sigma Modulators"; IEEE Journal of Solid-State Circuits; vol. 44, Issue 10, pp. 2722-2732 (Abstract only); Oct. 2009; https://ieeexplore.ieee.org.

Xianyao Li et al.; "Highly Efficient Silicon Michelson Interferometer Modulators"; IEEE Photonics Technology Letters; vol. 25, No. 5; Mar. 2013; pp. 407-409.

K P Zetie et al.; "How Does a Mach-Zehnder Interferometer Work?"; Teaching Physics; Phys. Educ. 35(1); Jan. 2000; pp. 46-48.

David Patel et al.; "High-Speed Compact Silicon Photonic Michelson Interferometric Modulator"; Optical Society of America; Optics Express; vol. 22, No. 22; Nov. 2014; pp. 26788-26802.

"Interferometry"; Wikipedia; May 2018; pp. 1-22; https://en.wikipedia.org.

International Search Report and Written Opinion; PCT International Searching Authority/US dated Oct. 15, 2018; International Application No. PCT/US2018/043346; 8 pages; International Searching Authority/United States, Commissioner for Patents; Alexandria, Virginia.

* cited by examiner

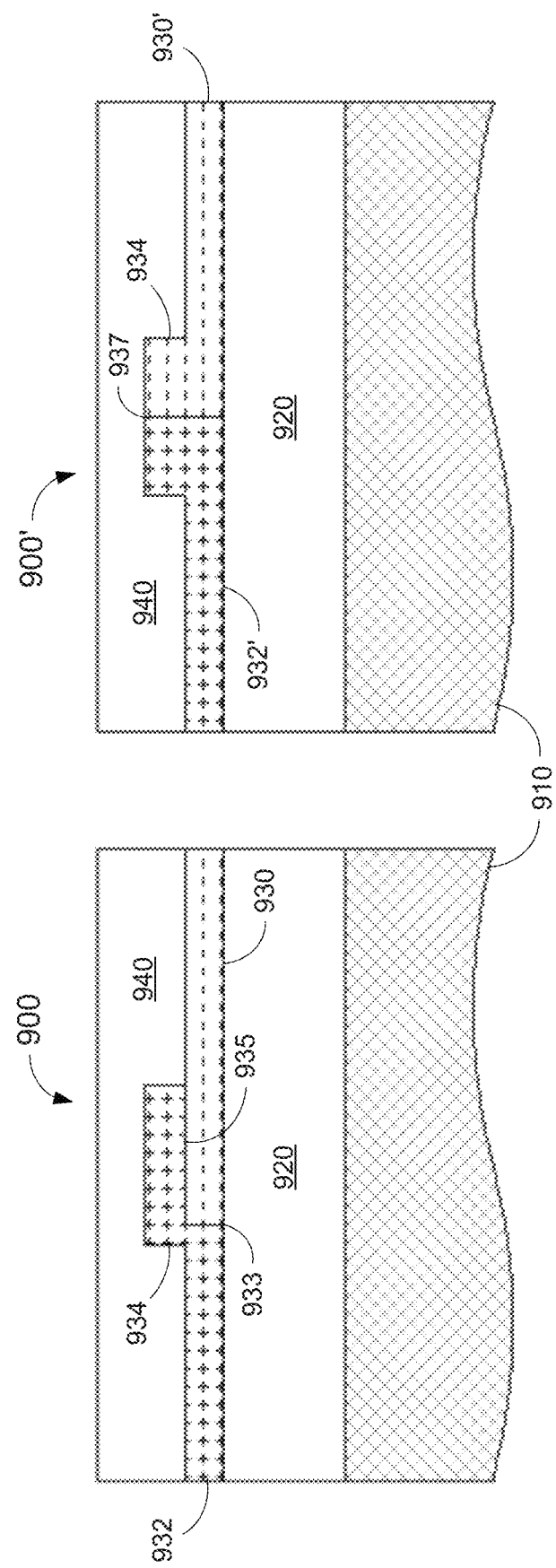

OPTICAL MODULATOR AND METHODS OF MAKING AND USING THE SAME

FIELD OF THE INVENTION

The present invention relates to the field of optical or optoelectronic transmitters, and particularly to optical modulators configured to modulate a continuous light beam to be output as an optical signal by an optical or optoelectronic transmitter.

DISCUSSION OF THE BACKGROUND

Optical or optoelectronic transceivers (which may be generally identified as "optical transceivers") convert electrical signals into optical signals and optical signals into electrical signals. An optical transceiver may include receiver and transmitter optical subassemblies, functional circuits, and electrical and optical interfaces, and are significant components in optical fiber communication systems and data storage networks.

The transmitter optical subassembly (TOSA) may include a laser diode configured to output a continuous light beam. The continuous light beam must be modulated to carry a data signal thereon. One way to modulate the intensity of a light beam is to modulate the current driving the light source (e.g., a laser diode). This type of modulation is called direct modulation, as opposed to external modulation (e.g., as is performed by an optical modulator).

In fiber optic communications, laser diodes emitting light having a narrow linewidth are often required. However, direct modulation of such laser diodes may be undesirable due to high-bandwidth "chirping" that can occur when applying the current to and removing the current from the laser.

External modulators may be electrical or optical. Depending on the parameter of a light beam which is manipulated, optical modulators may be categorized as amplitude modulators, phase modulators, polarization modulators, or others. Phase modulation (PM) is a modulation pattern that encodes information as variations in the instantaneous phase of a carrier wave. Some phase modulators may modulate the continuous light beam by applying a radio frequency (RF) signal to the continuous light beam. The phase of a carrier signal is modulated to follow the changing voltage level (amplitude) of the modulation signal provided to the RF signal source. The peak amplitude and frequency of the carrier signal remain constant, but as the amplitude of the information signal changes, the phase of the carrier changes correspondingly. The voltage required for inducing a phase change of $\pi$ is called the half-wave voltage.

A phase modulator can also be used as an amplitude modulator by using a Mach-Zehnder interferometer. A beam splitter divides the laser light into two paths, one of which has a phase modulator as described above. The beams are then recombined. Changing the electric field on the phase modulating path determines whether the two beams interfere constructively or destructively at the output, thereby controlling the amplitude or intensity of the exiting light. This device is called a Mach-Zehnder modulator.

For example, FIG. 1 shows a conventional optical modulator 100 including first and second connecting waveguides 105a-b, a first 2*2 optical coupler 106, first and second waveguides 108a-b, first and second low-speed phase shifters 110a-b, first and second high-speed phase shifters 112a-b, a second 2*2 optical coupler 114, and first and second output waveguides 115a-b. The optical modulator 100 modulates a continuous light beam emitted from a laser diode 102 to generate a modulated optical signal 116. The continuous light beam may be polarized, in which case it passes through an optical isolator 104 before entering the first 2*2 optical coupler 106. The optical isolator 104 reduces the amount of reflected light returning to the laser diode 102.

Each of the first and second 2*2 optical couplers 106 and 114 includes first and second ports 107a-b and 113a-b, respectively, at one end and third and fourth ports 107c-d and 113c-d, respectively, at an opposite end. The coupler 106 receives the continuous light beam at the first port 107a and outputs similar or substantially identical continuous light beams at each of the third and fourth ports 107c and 107d. Thus, the coupler 106 may thus function as a beam splitter. Subsequently, the waveguides 108a and 108b receive the light beams and pass the light beams through the first and second low-speed phase shifters 110a-b. The first and second low-speed phase shifters 110a-b operate by applying a controlled amount of thermal energy to the corresponding waveguide, thereby changing the temperature and the refractive index of the waveguide to correct for small errors in the phase of the similar or substantially identical continuous light beams. The light beams are then passed through the first and second high-speed phase shifters 112a-b, where first and second RF signals 111a-b are selectively applied to cause a phase difference between the light beams. Applying one of the RF signals 111a-b to the corresponding waveguide 108a or 108b results in a phase difference between the light beams in the waveguides 108a and 108b and destructive interference between the light beams when recombined. Applying the same RF signals 111a-b (or not applying either RF signal 111a or 111b) to the corresponding waveguide 108a or 108b results in the light beams in the waveguides 108a and 108b having the same phase and constructive interference between the light beams when recombined. The RF signals 111a-b can be deactivated or attenuated to change the data state of the optical signal created from the similar or substantially identical continuous light beams.

The coupler 114 receives the similar or substantially identical continuous light beams (at least one of which may be phase-shifted) at the first and second ports 113a-b, respectively. The coupler 114 functions as a beam combiner that combines the light beams from the waveguides 108a and 108b (which may be phase-shifted) into a modulated light beam 116, which is then output as a differential data signal on the output waveguides 115a and 115b respectively connected to the third and fourth ports 113c and 113d.

However, problems exist in optical modulators such as the optical modulator 100. For example, the RF signal is not always uniformly applied along the length of a linear phase shifter, and compensation techniques are often employed to compensate for non-uniform application of the electromagnetic field. In addition, linear waveguide-phase shifter combinations such as waveguides 108a-b and high-speed phase shifters 112a-b can consume a relatively large area or amount of device real estate. Also, relatively simple, non-tunable laser diodes emit light having a wavelength that changes or drifts slowly over time, but instantaneously with changes in temperature, and present compensation techniques are generally inadequate to fully compensate for such changes in output wavelength from such lasers.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

In one aspect, the present invention relates to an optical modulator comprising: (1) a first m*n optical coupler comprising m ports at a first end and n ports at a second end, wherein m is an integer of one or more and n is an integer of two or more, (2) a first waveguide coupled or connected to a first one of the n ports of the first m*n optical coupler, (3) a first phase shifter coupled to the first waveguide, (4) a first loop mirror at an end of the first waveguide, (5) a second waveguide coupled or connected to a second one of the n ports of the first m*n optical coupler, and (6) a second loop mirror at an end of the second waveguide. The first m*n optical coupler is configured to receive a continuous light beam at a first one of the m ports and output similar or substantially identical continuous light beams at each of the n ports. The first phase shifter is configured to shift a phase of the similar or substantially identical continuous light beam in the first waveguide in a first applied electromagnetic field. The first and second loop mirrors are configured to return the similar or substantially identical continuous light beam to the first and second waveguides, respectively. Alternatively, the first and second loop mirrors are configured to reverse a direction of the similar or substantially identical continuous light beam in the first and second waveguides, respectively. The returned similar or substantially identical continuous light beam in the first waveguide may be phase-shifted. The first m*n optical coupler is further configured to combine the returned (or reversed) similar or substantially identical continuous light beams from the first and second waveguides to form a modulated optical signal.

In general, the similar or substantially identical continuous light beams travel along optical paths through the first and second waveguides, the first and second loop mirrors, and back through the first and second waveguides having identical or substantially identical lengths. Thus, the first and second waveguides may have identical lengths, and the first and second loop mirrors may have identical lengths.

In some embodiments, the first phase shifter and the first waveguide have a curve or arc configured to maintain a phase difference of the first applied electromagnetic field along the first phase shifter of less than $\pi/p$, wherein p is greater than or equal to 2 (and more ideally, greater than or equal to 5). In some embodiments, the first phase shifter may comprise a plurality of different sections, and the first applied electromagnetic field may comprise a corresponding plurality of different radio frequency (RF) electromagnetic field applied to the plurality of different phase shifter sections. In other or further embodiments, the first phase shifter comprises a first high-speed phase shifter, and the optical modulator further comprises a first low-speed phase shifter in series with the first high-speed phase shifter (e.g., between the first m*n optical coupler and either the first high-speed phase shifter or the first loop mirror).

In some embodiments, each of the first and second loop mirrors comprises a 1*2 optical coupler and a looped waveguide connected at one end to a first port of the 1*2 optical coupler and at an opposite end to a second port of the 1*2 optical coupler. For example, the 1*2 optical coupler in the first and second loop mirrors may include the first and second ports at one end of the 1*2 optical coupler and a third port at an opposite end of the 1*2 optical coupler. The corresponding first or second waveguide may be coupled or connected to the third port of the 1*2 optical coupler in the loop mirrors.

In some embodiments, the optical modulator further comprises a second phase shifter coupled to the second waveguide. The second phase shifter is configured to shift a phase of the substantially similar or identical continuous light beam in the second waveguide in a second applied electromagnetic field. The second phase shifter may be identical or substantially identical to the first phase shifter, and may comprise a plurality of different sections (in which case the second applied electromagnetic field may comprise a corresponding plurality of different RF electromagnetic fields applied to the plurality of different second phase shifter sections) and/or further include a second low-speed phase shifter (in addition to the second high-speed phase shifter).

In some embodiments, the first and/or second electromagnetic fields have first and second states respectively corresponding to application of the electromagnetic field and non-application of the electromagnetic field. For example, application of the electromagnetic field may comprise turning on a radio frequency (RF) signal transmitter and/or generating an RF signal, and may correspond to a phase-shifted substantially similar or identical continuous light beam. Similarly, non-application of the electromagnetic field may comprise turning off the RF signal transmitter and/or deactivating or disabling the RF signal, and may correspond to a non-phase-shifted substantially similar or identical continuous light beam. In the case of the optical modulator comprising first and second phase shifters, the first and second states of the first applied electromagnetic field are respectively identical or substantially identical to the first and second states of the second applied electromagnetic field.

In further embodiments, the first electromagnetic field and (when present) the second electromagnetic field may have more than two states, generally in equally-divided increments from zero to full power, and the differences between the states of the electromagnetic fields corresponds to different values of data on or in the modulated optical signal. The data may be ternary (i.e., having one of three possible states), quaternary (i.e., having one of four possible states), or higher-order (i.e., having one of five or more possible states). Alternatively, the first state of the first applied electromagnetic field may be identical or substantially identical to the first state of the second applied electromagnetic field, but the second state of the first applied electromagnetic field may be different from the second state of the second applied electromagnetic field. For example, the second state of the first applied electromagnetic field may correspond to an RF voltage that is double (or one-half) of the RF voltage corresponding to the second state of the second applied electromagnetic field.

In some embodiments, the first m*n optical coupler is a 2*2 coupler, the optical modulator further comprises a third waveguide at a second one of the m ports of the first optical coupler, and the first optical coupler is configured to direct, guide or output the modulated optical signal to the third waveguide. In such embodiments, the optical modulator may further comprise a fourth waveguide configured to provide the continuous light beam to the first one of the m ports of the first m*n optical coupler.

In some embodiments, the first m*n optical coupler is a 1*2 optical coupler, and the optical modulator further comprises an optical circulator having at least first, second and third ports. The first port of the optical circulator may be (or is configured to be) optically coupled to a source of the continuous light beam. The second port of the optical circulator may be optically coupled to the first m*n optical coupler (e.g., at the $m^{th}$ or 1 port). The third port of the optical circulator may be (or is configured to be) optically coupled to an optical fiber (e.g., for transmission in an optical network). In typical embodiments, the optical circulator is configured to (i) direct or guide the continuous light beam from its first port to its second port and (ii) direct or guide the modulated optical signal from its second port to its third port.

The present optical modulator has particular advantage when manufactured as one or more photonic integrated circuits. In various embodiments, the first m*n optical coupler, the first and second waveguides, the first phase shifter (and, when present, the second phase shifter), and the first and second loop mirrors are on one or more photonic integrated circuits. In an ideal embodiment, the first m*n optical coupler, the first and second waveguides, the first and second phase shifters, and the first and second loop mirrors are on a single photonic integrated circuit. In further embodiments, a first circuit or driver configured to generate the first applied electromagnetic field (and, when the second phase shifter is present, a second circuit or driver configured to generate the second applied electromagnetic field) is present either on the same photonic integrated circuit as the first phase shifter or on a different integrated circuit (IC), adjacent to the photonic integrated circuit including the first phase shifter.

Thus, in further embodiments of the present optical modulator, the first m*n optical coupler, the first and second waveguides, the first phase shifter, and the first and second loop mirrors may be on a single photonic IC substrate or chip. In addition to the optical waveguides, the phase shifters and the optical couplers being on a single photonic chip, the single photonic chip may include, in sequence, a rigid substrate (e.g., a silicon wafer), an oxide layer (e.g., a silicon oxide layer having a thickness, for example, of from 1 micron to 5 microns), a silicon-on-oxide layer (e.g., a layer of monocrystalline silicon having a thickness, for example, of from 0.2 micron to 5 microns, configured or patterned to guide and/or manipulate light therein), one or more dielectric layers, and a plurality of metal traces (e.g., one or more metal trace layers and one or more conductive contact layers) in and/or on the one or more dielectric layers. For example, the silicon-on-oxide layer may be configured or patterned to include one or more sections of the first waveguide therein and the first phase shifter (which encompasses or surrounds the section[s] of the first waveguide). The first waveguide may be defined by one or more p-n junctions thereon (or at a periphery thereof), such as a p-doped region at a lowermost or uppermost surface or border of the waveguide and a n-doped region at the other of the lowermost and uppermost surface or border of the waveguide. The first (high-speed) phase shifter may comprise a thin doped silicon region adjacent to the waveguide and connected to the doped silicon regions that define the waveguide to change or adjust a voltage across the p-n junction when the first electromagnetic field is applied, and thus change the phase of the light in the first waveguide. Other waveguides and high-speed phase shifters may be similarly or identically constructed.

In another aspect, the present invention relates to a compound optical modulator comprising first and second identical or substantially identical optical modulator units, first and second connecting waveguides, and a third m*n optical coupler. At least one of the first and second optical modulator units is the present optical modulator, and the first and second optical modulators may function as an in-phase optical modulator and a quadrature optical modulator. In some embodiments, m is 2 in each of the first and second optical modulator units, and each of the first and second optical modulator units further comprises an output waveguide at a second one of the m ports of the m*n optical coupler therein. The first connecting waveguide may be configured to (i) provide the continuous light beam to a first m*n optical coupler in the first optical modulator and optionally (ii) receive a first modulated optical signal from the first optical modulator. The second connecting waveguide may be configured to (i) provide a similar or substantially identical copy of the continuous light beam in the first connecting waveguide to a second m*n optical coupler in the second optical modulator and optionally (ii) receive a second optical signal from the second optical modulator. The third m*n optical coupler may be configured to receive an output from a continuous light continuous light source (e.g., a laser or laser diode) in a first one of its m ports and split the output of the continuous light source (e.g., into the continuous light beam and a similar or substantially identical copy of the continuous light beam) for transmission through the first and second ones of its n ports to the first and second connecting waveguides, respectively. In various embodiments, the third m*n optical coupler is a third 1*2 coupler or a third 2*2 optical coupler. In some embodiments, the compound optical modulator further comprises (i) an in-phase phase shifter coupled to the first connecting waveguide, configured to shift a phase of the continuous light beam and the modulated optical signal in the first connecting waveguide in response to a first stimulus, and (ii) a quadrature phase shifter coupled to the second connecting waveguide, configured to shift a phase of the substantially identical copy of the continuous light beam and a quadrature-modulated optical signal in the second connecting waveguide in response to a second stimulus.

Alternatively or additionally, the third m*n optical coupler may be configured to (i) receive reflected light from the first and second connecting waveguides through the first and second ones of its n ports, and/or (ii) combine the reflected light from the first and second connecting waveguides to reduce or eliminate the reflected light from returning to the laser (e.g., by destructive interference). In such embodiments, the compound optical modulator may further comprise third and fourth low-speed phase shifters respectively coupled to the first and second connecting waveguides and configured to reduce or eliminate reflected light from returning to the laser (e.g., by shifting a phase of the light in one or both of the first and second connecting waveguides such that the reflected light from one of the connecting waveguides destructively interferes with the reflected light from the other connecting waveguide in the third m*n optical coupler).

In another aspect, the present invention relates to a modulated laser comprising the present optical modulator and a laser configured to emit the continuous light beam. The modulated laser may further comprise an optical isolator between the laser and the m*n optical coupler. The optical isolator may be configured to prevent reflected light from returning to the laser or at least reduce an amount of such reflected light that returns to the laser.

In another aspect, the present invention relates to a method of modulating a continuous light beam comprising (1) receiving the continuous light beam at a first one of m ports of an m*n optical coupler comprising the m ports at a first end thereof and n ports at a second end thereof, wherein m is an integer of one or more and n is an integer of two or more, (2) outputting similar or substantially identical continuous light beams to first and second waveguides respectively coupled or connected to first and second ones of the n ports of the m*n optical coupler, (3) selectively applying a first electromagnetic field to shift or not shift a phase of the similar or substantially identical continuous light beam in the first waveguide using a first phase shifter coupled to the first waveguide, (4) using first and second loop mirrors at respective ends of the first and second waveguides, returning the similar or substantially identical continuous light beams to the first and second waveguides, and (5) combining the returned similar or substantially identical continuous light beams from the first and second waveguides in the m*n optical coupler to form a modulated optical signal.

In some embodiments, similarly or identically to the present optical modulator, the first phase shifter and the first waveguide may have a curve or arc configured to maintain a phase difference of the first applied electromagnetic field along the first phase shifter of less than $\pi/p$, wherein p is greater than or equal to 2 (and more ideally, greater than or equal to 5). For example, the first phase shifter and the first waveguide may have a curve or arc such that the curve or arc of the first phase shifter has a maximum dimension of ¼ of a wavelength of radiation of the first electromagnetic field or less. In such embodiments, the second waveguide and (when present) the second phase shifter may have an identical curve or arc, and the method may further comprise transmitting and returning the similar or substantially identical continuous light beams along the curves or arcs of the first and second waveguides.

In other or further embodiments, the first phase shifter may comprise a first high-speed phase shifter, and like the present optical modulator, the optical modulator may further comprise a first low-speed phase shifter in series with the first high-speed phase shifter (e.g., between the first m*n optical coupler and either the first high-speed phase shifter or the first loop mirror). In such embodiments, the method may further comprise applying sufficient thermal energy to the first waveguide using the first low-speed phase shifter to change the refractive index of the first waveguide, and optionally, to a value of the refractive index sufficient to adjust the phase of the similar or substantially identical continuous light beam in the first waveguide by a predetermined amount.

In some embodiments, as for the present optical modulator, each of the first and second loop mirrors comprises a 1*2 optical coupler and a looped waveguide connected at one end to a first port of the 1*2 optical coupler and at an opposite end to a second port of the 1*2 optical coupler. In such embodiments, the method may further comprise receiving the similar or substantially identical continuous light beam (which may be phase-shifted) at a third port of the 1*2 optical coupler, outputting the similar or substantially identical continuous light beam through the first port of the 1*2 optical coupler to the looped waveguide, receiving the returned similar or substantially identical continuous light beam port at the second port of the 1*2 optical coupler, and/or outputting the returned similar or substantially identical continuous light beam through the third port of the 1*2 optical coupler to the corresponding first or second waveguide.

In some embodiments, as for the present optical modulator, a second phase shifter may be coupled to the second waveguide. Therefore, the method may further comprise selectively applying a second applied electromagnetic field to shift or not shift a phase of the substantially similar or identical continuous light beam in the second waveguide using the second phase shifter. The second phase shifter may comprise a second high-speed phase shifter, in which case the optical modulator may further comprise a second low-speed phase shifter in series with the second high-speed phase shifter. When the optical modulator comprises the second low-speed phase shifter, the method may further comprise applying sufficient thermal energy to the second waveguide using the second low-speed phase shifter to change the refractive index of the second waveguide, and optionally, to a value of the refractive index sufficient to adjust the phase of the similar or substantially identical continuous light beam in the second waveguide by a predetermined amount. The second (high-speed) phase shifter and (when present) the second low-speed phase shifter may be identical or substantially identical to the first (high-speed) phase shifter and the first low-speed phase shifter, respectively.

In some embodiments, the first and (when present) second electromagnetic fields have first and second states respectively corresponding to application of the electromagnetic field and non-application of the electromagnetic field. For example, application of the electromagnetic field may comprise turning on a radio frequency (RF) signal transmitter and/or generating an RF signal, and may correspond to or result in a phase-shifted similar or substantially identical continuous light beam. Similarly, non-application of the electromagnetic field may comprise turning off the RF signal transmitter and/or deactivating or disabling the RF signal, and may correspond to or result in a non-phase-shifted similar or substantially identical continuous light beam.

In cases where the method uses first and second phase shifters, applying one of the first and second applied electromagnetic fields and not applying the other of the first and second applied electromagnetic fields results in destructive interference of the similar or substantially identical continuous light beams in the optical coupler, and either applying or not applying both of the first and second applied electromagnetic fields results in constructive interference of the similar or substantially identical continuous light beams in the optical coupler. The first and second states of the first applied electromagnetic field may be respectively identical or substantially identical to the first and second states of the second applied electromagnetic field.

In further embodiments, and similarly or identically to the optical modulator, the first and second electromagnetic fields may have more than two states, generally in equally-divided increments from zero to full power or voltage, and the differences between the states of the electromagnetic fields correspond to different values of data on or in the modulated optical signal. Such data may have three or more possible states. Accordingly, in such embodiments, the method may further comprise applying a first one of p increments of RF voltage to the first phase shifter and, when the second phase shifter is present, a second one of p increments of RF voltage to the second phase shifter, where p is an integer of 3 or more. In one embodiment using the first and second phase shifters, the first and second increments of RF voltage may be the same at only a single value of the RF voltage (e.g., 0 V or Vmax/2, where $V_{max}$ is the maximum RF voltage).

In some embodiments, the m*n optical coupler is a 2*2 optical coupler, a third waveguide is connected to a second one of the m ports of the 2*2 optical coupler, and the 2*2 optical coupler is configured to direct, guide or output the modulated optical signal to the third waveguide. In such embodiments, a fourth waveguide may be configured to provide the continuous light beam to the first one of the m ports of the 2*2 optical coupler.

In some embodiments, the m*n optical coupler is a 1*2 optical coupler, and the method further comprises using an optical circulator having at least first, second and third ports to direct the continuous light beam and the modulated optical signal from one port to another. The first port of the optical circulator may be (or is configured to be) optically coupled to a source of the continuous light beam. The second port of the optical circulator may be optically coupled to the 1*2 optical coupler (e.g., at the $m^{th}$ or 1 port). The third port of the optical circulator may be (or is configured to be) optically coupled to an optical fiber (e.g., for transmission in an optical network). In typical embodiments, the optical circulator is configured to (i) direct or guide the continuous light beam from its first port to its second port and (ii) direct or guide the modulated optical signal from its second port to its third port.

In yet another aspect, the present invention relates to a method of manufacturing an optical modulator, comprising forming first and second waveguides, an m*n optical coupler, and at least a first phase shifter, and first and second loop mirrors in one or more photonic integrated circuits, such that the first and second waveguides are respectively optically coupled or connected to first and second ones of the n ports of the m*n optical coupler, the first phase shifter is coupled to the first waveguide, and the first and second loop mirrors are optically connected to respective ends of the first and second waveguides. As for other aspects of the present invention, m is an integer of one or more, n is an integer of two or more, the m*n optical coupler is configured to receive a continuous light beam at a first one of the m ports and output similar or substantially identical continuous light beams at the first and second ones of the n ports, the first phase shifter is configured to shift a phase of the similar or substantially identical continuous light beam in the first waveguide in a first applied electromagnetic field, and the first and second loop mirrors are configured to return the similar or substantially identical continuous light beams to the first and second waveguides.

In some embodiments, the first phase shifter and the first waveguide may be formed in a curve or arc configured to maintain a phase difference of the first applied electromagnetic field along the first phase shifter of less than $\pi/p$, wherein p is greater than or equal to 2 (and more ideally, greater than or equal to 5). As for the present optical modulator, the curve or arc of the first phase shifter may have a maximum dimension of ¼ of a wavelength of radiation of the first electromagnetic field or less. In other or further embodiments, the first phase shifter comprises a first high-speed phase shifter, and the method may further comprise forming a first low-speed phase shifter in series with the first high-speed phase shifter (e.g., between the m*n optical coupler and either the first high-speed phase shifter or the first loop mirror).

In some embodiments, forming each of the first and second loop mirrors may comprise forming (i) a 1*2 optical coupler optically coupled or connected to the corresponding first or second waveguide and (ii) a looped waveguide optically coupled or connected at one end to a first port of the 1*2 optical coupler and at an opposite end to a second port of the 1*2 optical coupler. As for the present optical modulator, the 1*2 optical coupler in the first and second loop mirrors may include the first and second ports at one end of the 1*2 optical coupler and a third port at an opposite end of the 1*2 optical coupler. The corresponding first or second waveguide may be coupled or connected to the third port of the 1*2 optical coupler in the loop mirrors.

In some embodiments, the method further comprises forming a second phase shifter coupled to the second waveguide. As for the present optical modulator, the second phase shifter may be configured to shift a phase of the substantially similar or identical continuous light beam in the second waveguide in a second applied electromagnetic field, and may be identical or substantially identical to the first phase shifter.

In some embodiments, the m*n optical coupler is a 2*2 coupler, and the method may further comprise forming a third waveguide optically coupled or connected to a second one of the m ports of the first optical coupler. As for the present optical modulator, the 2*2 optical coupler is configured to direct, guide or output the modulated optical signal to the third waveguide. In such embodiments, the method may further comprise forming a fourth waveguide coupled or connected to the first one of the m ports of the 2*2 optical coupler and/or configured to provide the continuous light beam to the first one of the m ports of the 2*2 optical coupler.

In other embodiments, the m*n optical coupler is a 1*2 optical coupler, and the method further comprises forming and/or connecting an optical circulator having at least first, second and third ports to the m or one ("1") port of the 1*2 optical coupler. In such embodiments, the method may further comprise optically coupling (i) the first port of the optical circulator to a source of the continuous light beam, (ii) the second port of the optical circulator to the 1*2 optical coupler (e.g., at the m or 1 port), and/or (iii) the third port of the optical circulator to an optical fiber (e.g., for transmission in an optical network).

The present invention advantageously doubles the efficiency of the phase shifter(s) as a result of its reflective structure. By using curved or arced phase shifters instead of linear phase shifters, the present optical modulator enables more uniform application of the electromagnetic field(s) to the (high-speed) phase shifter(s), and thus reduces the effect of any difference or variation in the RF field to the phase shift per unit length of the waveguide across the entire length of the phase shifter and can be driven as a lumped element (see paragraph [0068] for a more detailed discussion of a lumped element). The curved or arced phase shifter, in addition to the doubled efficiency (thus halving the required length), also greatly reduces the modulator area.

In addition, embodiments in which the modulator has different optical paths with the same length and substantially the same structure with the same materials (e.g., a "balanced arm length") will have the same or substantially the same phase drift in or on all paths when experiencing the same laser/waveguide temperature changes and/or laser wavelength changes, and ideally, this phase drift in different optical paths cancels each other since the output signal state is decided by the phase difference between the different optical paths. Additionally, embodiments that include a low-speed phase shifter in each such path can easily adjust the phase change in each path separately to compensate for the possible small variations caused by phase drift imbalance due to imperfect fabrication processing or temperature differences between the different arms or optical paths. Furthermore, compound modulators with multi-stage couplers or multiple coupler stages are able to drive multiple signals with a single laser and reduce or eliminate light reflected back to the laser by destructive interference, which can reduce or remove requirements for an isolator. This enables facile generation of multiple optical signals from a single laser or laser diode, and is extendable to almost any number of modulators and optical couplers. These and other features and advantages of the present invention will become readily apparent from the detailed description of various embodiments below.

BRIEF DESCRIPTION OF THE DRAWINGS

FIGS. 9A-B show cross-sections of exemplary integrated photonic chips according to embodiments of the present invention.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures and components have not been described in detail so as not to unnecessarily obscure aspects of the present invention. Furthermore, it should be understood that the possible permutations and combinations described herein are not meant to limit the invention. Specifically, variations that are not inconsistent may be mixed and matched as desired.

For the sake of convenience and simplicity, the terms "transceiver," "optical transceiver" and "optoelectronic transceiver" may be used interchangeably, as may the terms "optical" and "optoelectronic," the terms "connected to," "coupled with," "coupled to," and "in communication with" (which include both direct and indirect connections, couplings and communications), the terms "mounting," "affixing," "attaching" and "securing" (and grammatical variations thereof), and the terms "data," "information" and "bit(s)," but these terms are generally given their art-recognized meanings.

The term "length" generally refers to the largest dimension of a given 3-dimensional structure or feature. The term "width" generally refers to the second largest dimension of a given 3-dimensional structure or feature. The term "thickness" generally refers to a smallest dimension of a given 3-dimensional structure or feature. The length and the width, or the width and the thickness, may be the same in some cases (e.g., cylindrical structures such as optical fibers and certain other optical waveguides). A "major surface" refers to a surface defined by the two largest dimensions of a given structure or feature, which in the case of a structure or feature having a partially or completely circular or spherical surface, may be defined by the radius of the circle or sphere.

A First Exemplary Optical Modulator Including an Optical Isolator

Figure 1:
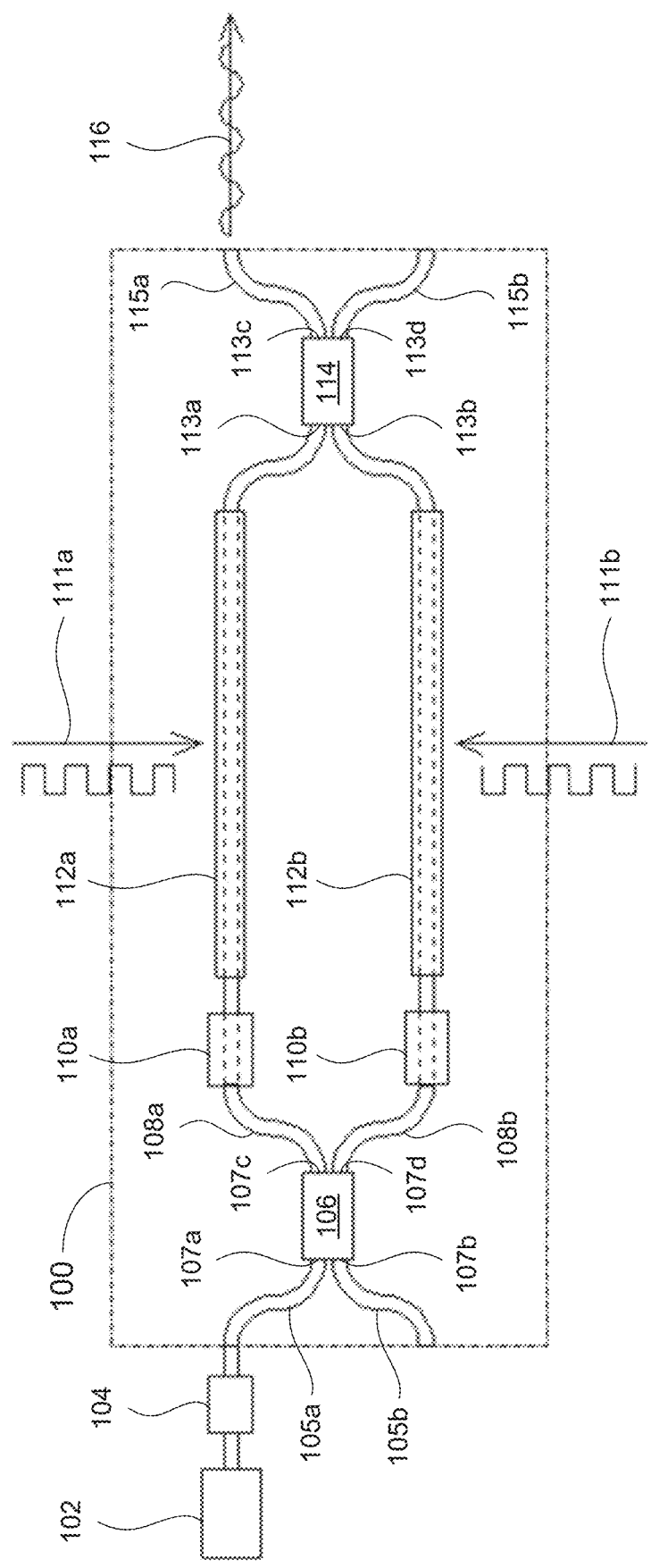
FIG. 1 shows a conventional optical modulator configured to modulate a continuous light beam from a conventional laser diode.
Figure 2:
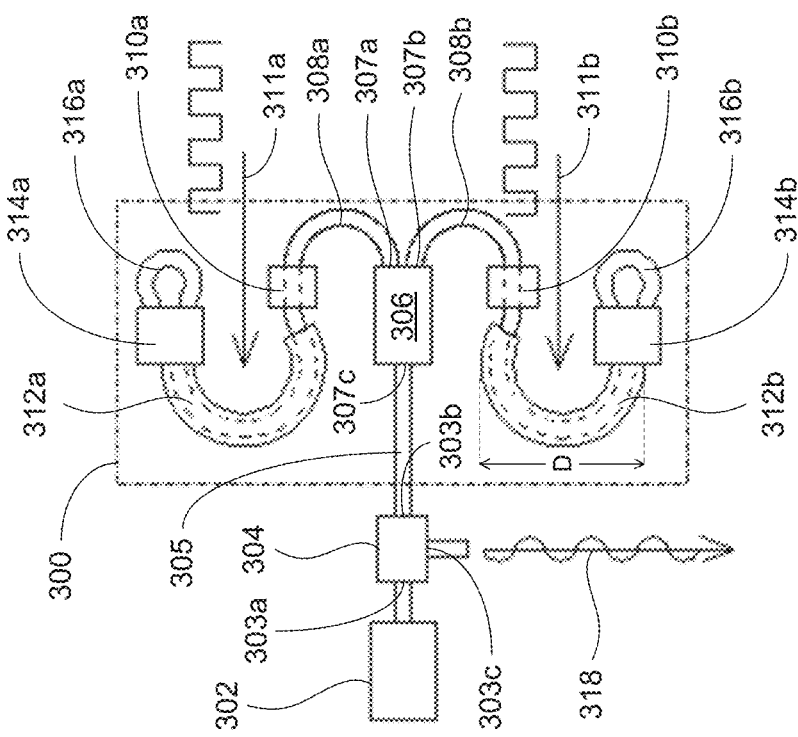
FIG. 2 shows an exemplary optical modulator including a 2*2 optical coupler in accordance with one or more embodiments of the present invention.

FIG. 2 shows an exemplary optical modulator 200 including first and second connecting waveguides 205a-b, a 2*2 optical coupler 206, first and second waveguides 208a-b, first and second low-speed phase shifters 210a-b, first and second high-speed phase shifters 212a-b, first and second 1*2 optical couplers 214a-b, and first and second looped waveguides 216a-b. Each of these components can be formed on one or more photonic integrated circuits, and ideally, on a single photonic integrated circuit substrate or chip. The optical modulator 200 outputs a modulated optical signal 218. FIG. 2 also shows a laser source 202 and an optical isolator 204, configured to provide a continuous light beam to the optical modulator 200. The optical modulator 200 modulates the continuous light beam from the laser diode 202 to generate the modulated optical signal 218. The continuous light beam may be polarized, in which case it may pass through a polarizer (not shown) prior to the optical isolator 204. In the case of an unpolarized or non-coherent light beam, the continuous light beam may pass through one or more filters (not shown), rather than the optical isolator 204, before entering the 2*2 optical coupler 206. The optical isolator 204 reduces the amount of light reflected and/or returned to the laser diode 202 by rotating the polarity of the continuous light beam and the reflected and/or returned light in the same direction (e.g., to change the polarity type of the reflected and/or returned light) and filtering the rotated and reflected/returned light.

The laser diode 202 may be included in a transmitter optical subassembly (TOSA), which in turn may be part of an optical transmitter or an optical transceiver (e.g., a device including both a transmitter and a receiver). The laser diode 202 may be a double heterostructure laser, a separate confinement heterostructure laser, a quantum well laser, a quantum cascade laser, an interband cascade laser, a distributed Bragg reflector laser, a distributed feedback laser, a vertical cavity laser, a vertical-cavity surface-emitting laser [VCSEL], a vertical external-cavity surface-emitting laser [VECSEL], an external-cavity diode laser, or other device that converts an electrical current or signal into light. The optical transceiver may be contained in a housing compliant with a standard package, such as a small form-factor pluggable (SFP) package, a small form-factor pluggable plus (SFP+) package, a Gigabit small form-factor pluggable (XFP) package, a quad SFP pluggable (QSFP) package, or a gigabit interface converter (GBIC) package.

The first connecting waveguide 205a may carry the continuous light beam from the laser-isolator 202-204 to the 2*2 optical coupler 206. The 2*2 optical coupler 206 may comprise first and second ports 207a-b at a first end and third and fourth ports 207c-d at a second end (facing the waveguides 208a-b). The first port 207a is optically coupled to the first connecting waveguide 205a and receives the continuous light beam from the laser diode 202. In the embodiment shown in FIG. 2, m is two, and n is two. The 2*2 optical coupler 206 is configured to split the continuous light beam into similar or substantially identical continuous light beams (e.g., each having about half the amplitude of the original continuous light beam). Thus, with regard to the continuous light beam from the laser diode 202, the coupler 206 may include and/or function as a non-selective beam splitter. The optical coupler 206 may further include one or more reflectors or mirrors (e.g., total reflection mirrors).

The similar or substantially identical continuous light beams may exit the two output (and return input) ports 207c-d of the 2*2 optical coupler 206 with a phase difference of $\pi$. However, the phase difference between the light beams in the two optical paths downstream from the 2*2 coupler 206 (i.e., in the waveguides 208a-b) is not a serious concern, because a phase difference of up to a few $\pi$ can be compensated by the amount or dose of thermal energy applied by the low-speed phase shifters 210a-b. The wavelength of IR light typically used in conventional optical fiber communications is less than 1 μm, and thus a phase difference of n corresponds to a sub-micron length.

Subsequently, the waveguides 208a and 208b each receive the similar or substantially identical continuous light beams and carry the light beams through the first and second low-speed phase shifters 210a-b. The first and second low-speed phase shifters 210a-b operate by applying a variable amount of thermal energy to the waveguides 208a and 208b to correct for small errors in the phase of the similar or substantially identical continuous light beams in the waveguides 208a and 208b. The similar or substantially identical continuous light beams are then passed through the first and second high-speed phase shifters 212a-b, at least one of which may cause a phase difference between the similar or substantially identical continuous light beams. Generally, applying different RF signals 211a-b to the corresponding waveguides 208a-b results in (i) a phase difference between the light beams in the waveguides 208a and 208b and (ii) at least partial destructive interference between the light beams when recombined. Applying the same RF signals 211a-b (or deactivating or not applying both RF signals 211a and 211b) to the corresponding waveguides 208a and 208b results in (i) the light beams in the waveguides 208a and 208b having the same phase and (ii) constructive interference between the light beams when recombined.

In further embodiments, the first and second high-speed phase shifters 212a-b may each comprise a plurality of different sections. Each section may receive a separate RF signal (e.g., a corresponding RF electromagnetic field section) from a corresponding RF signal generator (e.g., an RF field generator circuit or chip). Typically, the number and configuration of sections in the second high-speed phase shifter 212b are the same as the first high-speed phase shifter 212a. Adjacent phase shifter sections may be separated by a direct current (DC) isolation section. Furthermore, each phase shifter section may be coupled to a corresponding RF driver circuit or chip. Exemplary sectional or segmented phase shifters are disclosed in U.S. Pat. No. 7,515,778, the relevant portions of which are incorporated herein by reference.

The RF signals 211a-b can be set at or attenuated to different levels to provide multiple data values or states for the optical signal 218 (which is created from the similar or substantially identical continuous light beams in the waveguides 208a-b). The RF signals 211a-b may have more than two states (e.g., in equally-divided increments from zero to full power), and different combinations of states of the RF signals 211a-b correspond to different data values for the modulated optical signal. More particularly, both the RF signals 211a-b and the modulated optical signal data may have p possible states, where p is an integer of three or more. In general, the amount of phase shift caused or applied by the first and second high-speed phase shifters 212a-b is proportional to the RF voltage. Accordingly, a first one of p increments of RF voltage may be applied to the first high-speed phase shifter 212a by the first RF signal 211a and, when the second high-speed phase shifter 212b is present, a second one of the p increments of RF voltage may be applied to the second high-speed phase shifter 212b by the second RF signal 211b. When both the first and second high-speed phase shifters 212a-b are present, the first and second increments of RF voltage may be the same or different, and the first and second increments of RF voltage may be the same at only a single value of the RF voltage (e.g., 0 V or $V_{max}/2$).

For example, when p is three, the increments of RF voltage may be 0, $V_{max}/2$, and $V_{max}$. When the first and second RF signals 211a-b have the same voltage increment or state (e.g., zero voltage, $V_{max}/2$, or $V_{max}$), the modulated optical signal data may have a first value (e.g., a state of "1" or an equivalent thereto). When the first and second RF signals 211a-b have respective increments of RF voltage that differ by one increment (e.g., the first RF signal 211a is at zero voltage or $V_{max}$, and the second RF signal 211b is at $V_{max}/2$), the modulated optical signal data may have a second value (e.g., a state of "0" or an equivalent thereto). When the first and second RF signals 211a-b have respective increments of RF voltage that differ by two increments (e.g., the first RF signal 211a is at zero voltage and the second RF signal 211b is at $V_{max}$, or the first RF signal 211a is at $V_{max}$ and the second RF signal 211b is at zero voltage), the modulated optical signal data may have a third value (e.g., a state of "−1" or an equivalent thereto).

Similarly, when p is four, the increments of RF voltage may be 0, $V_{max}/3$, $2*V_{max}/3$, and full voltage. When both the first and second RF signals 211a-b have the same state (e.g., zero voltage, $V_{max}/3$, $2*V_{max}/3$, or $V_{max}$), the modulated optical signal data may have a first value (e.g., a state of "3" or an equivalent thereto). When the first and second RF signals 211a-b differ by one increment of RF voltage (e.g., the first RF signal 211a may be at zero voltage, and the second RF signal 211b may be at $V_{max}/3$), the modulated optical signal data has a second value (e.g., a state of "2" or an equivalent thereto). When the first and second signals 211a-b differ by two increments of RF voltage (e.g., the first RF signal 211a is at zero voltage and the second RF signal 211b is at $2*V_{max}/3$, or the first RF signal 211a is at full voltage and the second RF signal 211b is at $V_{max}/3$), the modulated optical signal data has a third value (e.g., a state of "1" or an equivalent thereto). When the first and second RF signals 211a-b differ by three increments of RF voltage (e.g., one of the first and second RF signals 211a-b is at zero voltage or $V_{max}$, and the other of the first and second RF signals 211a-b is at the other of zero voltage and $V_{max}$), the modulated optical signal data has a fourth value (e.g., a state of "0" or an equivalent thereto). It is within the level of ordinary skill in the art to implement similar systems in which p is 5, 6, 10, 12, 16, or more.

In a further alternative, one may create four different data values or states for the optical signal 218 by applying RF signals having only two states to each of the first and second high-speed phase shifters 212*a-b*. For example, the optical path including one of the first and second high-speed phase shifters 212*a-b* may be labeled or considered the least significant bit (LSB) path, and the optical path including the other of the first and second high-speed phase shifters 212*a-b* may be labeled or considered the most significant bit (MSB) path. The RF voltage in the LSB path may alternate between phase shift states corresponding to 0 and −1 (e.g., 0 V and $V_{max}/2$), while the RF voltage in the MSB path may alternate between phase shift states corresponding to 0 and 2 (e.g., 0 V and $V_{max}$). Thus, the data state of the combined optical signal 218 depends on the difference between phase shift states according to the following equation:

MSB−LSB=Data state of optical signal 218

For example, when MSB and LSB are both 0, the difference is 0, and the data state of the combined optical signal 218 may be 0. When MSB is 0 and LSB is (−1), the difference is 1, and the data state of the combined optical signal 218 may be 1. When MSB is 2 and LSB is 0, the difference is 2, and the data state of the combined optical signal 218 may be 2. When MSB is 2 and LSB is (−1), the difference is 3, and the data state of the combined optical signal 218 may be 3. Consequently, one may create a four-state optical data signal from 2 RF signals, each having only two states.

The low-speed phase shifters 210*a-b*, high-speed phase shifters 212*a-b*, and the waveguides 208*a-b* may have a curve or arc configured to maintain a phase difference of the first and second RF signals 211*a-b* of less than π/p, wherein p is greater than or equal to 2 (and more ideally, 5, 6, 8, 10, or any other number greater than 2). One rule of thumb in RF design is that a "lumped element" (i.e., a device or structure that can be considered to have uniform properties across the entire device or structure) has no feature or structure that exceeds 1/10 of the wavelength of the applicable radiation at the maximum frequency of its usage. When the maximum feature or structure size exceeds 1/10 of the wavelength, the phase difference across the device exceeds π/5 and starts to play a role, the effect of the RF signal becomes more complicated, the phase change behavior becomes less predictable, and the "lumped element" assumption becomes considerably less accurate. However, one can compensate for such complications using known techniques and/or algorithms, and the present invention encompasses modulators including such components and configurations.

When the feature size exceeds ¼ of the wavelength or the phase difference across the device exceeds 90° or π/2, the effect of the RF signal applied to different parts of the device starts to cancel each other, the presumptions of a "lumped element" are no longer valid, and the application of the RF signal on the phase shifter must take into consideration the device geometry and the wave property(ies) of the RF signal. A widely-applied design method for high-speed large size photonic devices is called "travelling-wave" design, where the device is configured such that the optical wave and the RF wave travel together across the device at same speed. However, this method is difficult to apply to a reflective modulator (such as the present optical modulator having loop mirrors) because the optical wave travels in two opposing directions in the waveguide. Thus, the curve or arc of the first phase shifter and the first waveguide may be such that the first phase shifter has a maximum dimension D (see the second phase shifter 312*b* in FIG. 3) of ¼ of a wavelength of the radiation of the first electromagnetic field or less. As shown, the maximum dimension D is the length or width of the layout area of the phase shifter.

There are two electromagnetic waves with which the high-speed phase shifters 212*a-b* interact: (a) the optical wave in the waveguides 208*a-b*, having a wavelength on the order of ~1 μm, and (b) the RF wave, having a wavelength on the order of ~1 mm. Curving or arcing the high-speed phase shifters may result in the size (i.e., one or more dimensions) of the phase shifter being <1/10 of the RF wavelength. Thus, in optimal embodiments, p is such that the length and width of the high-speed phase shifters 212*a-b* is less than or equal to 1/10 of the RF wavelength.

The first and second RF signals 211*a-b* have first and second states respectively corresponding to application of the electromagnetic field and non-application of the electromagnetic field. For example, application of the electromagnetic field may comprise turning on radio frequency (RF) signal transmitters and/or generating the RF signals 211*a-b*, and may correspond to a phase-shifted substantially similar or identical continuous light beam. Similarly, non-application of the electromagnetic field may comprise turning off the RF signal transmitters and/or deactivating or disabling the RF signals 211*a-b*, and may correspond to a non-phase-shifted substantially similar or identical continuous light beam. The first and second states of the RF signal 211*a* may be respectively identical or substantially identical to the first and second states of the RF signal 211*b*.

Next, the similar or substantially identical continuous light beams are each received by first and second loop mirrors comprising the first and second 1*2 optical couplers 214*a-b* and the first and second looped waveguides 216*a-b*. The first and second loop mirrors are configured to return the similar or substantially identical continuous light beams to the first and second waveguides 208*a-b*, respectively (one or both of which may be phase-shifted). Alternatively, the first and second loop mirrors may be configured to reverse a direction of the similar or substantially identical continuous light beams in the first and second waveguides 208*a-b*, respectively. Typically, if the beam was phase-shifted when passing through the waveguide 208*a* or 208*b* and the high-speed phase shifter 212*a* or 212*b*, the returned beam is phase-shifted again on the return pass through the waveguide and phase shifter.

Each of the 1*2 optical couplers 214*a-b* may be respectively connected to the looped waveguides 216*a-b*. Each of the looped waveguides 216*a-b* may be respectively connected at one end to a first port 215*a* or 217*a* of the 1*2 optical couplers 214*a-b* and at an opposite end to a second port 215*b* or 217*b* of the 1*2 optical couplers 214*a-b*. For example, the 1*2 optical couplers 214*a-b* may each include the first and second ports 215*a-b* and 217*a-b* at one end of the 1*2 optical couplers 214*a-b* and a third port 215*c* or 217*c* at an opposite end of the 1*2 optical couplers 214*a-b*. The corresponding first or second waveguides 208*a-b* may be coupled or connected to the third port 215*c* and 217*c* of the 1*2 optical couplers 214*a-b*.

Each of the returned light beams pass through the waveguides 208*a-b* in a direction opposite to the original similar or substantially identical light beam (i.e., back to the 2*2 coupler 206). If the low-speed phase shifters 210*a-b* and the high-speed phase shifters 212*a-b* were active when the similar or substantially identical continuous light beams first passed through the waveguides 208*a-b*, the phase shifters 210*a-b* and 212*a-b* may continue to shift the phase of the returned light beams. The phase of the light beams may be shifted by π/q when they first pass through the waveguides 208*a-b*, and the phase of the returned light beams may be shifted once again by π/q when returning through the waveguides 208*a-b* to the 2*2 optical coupler 206 (where q is an integer of at least 2, such as 2, 3, 4, 6, 8 etc.). The returned light beams are received at the third and fourth ports 207*c-d* of the 2*2 optical coupler 206, and the returned light beams are combined by the 2*2 optical coupler 206 to form a modulated optical signal 218. If the returned beams are in-phase, they interfere constructively when the modulated optical signal 218 is formed. If the returned beams are out of phase, they interfere destructively when the modulated optical signal 218 is formed. The coupler 206 may thus also function as a beam combiner configured to combine the returned (or reflected) similar or substantially identical continuous light beams from the first and second waveguides 208*a-b* to form the modulated optical signal 218. The coupler 206 is configured to output the modulated optical signal 218 on or to the second connecting waveguide 205*b* optically coupled to the port 207*b*.

Thus, the similar or substantially identical continuous light beams travel along respective optical paths through the first and second waveguides 208*a-b*, the first and second loop mirrors, and back through the first and second waveguides 208*a-b*. The optical paths have identical or substantially identical lengths (e.g., balanced arm lengths), and optionally, identical geometric configurations (e.g., arc or curve lengths and angles, placements of phase shifters and optical couplers, etc.). Ideally, the optical paths do not have a significant length difference (e.g., a length difference of 20 μm or more) between the two arms, because such a length difference may cause a dramatic change in the phase difference of the two similar or substantially identical continuous light beams when the wavelength of light emitted from the laser 202 or the temperature of the laser 202 changes. Thus, the first and second waveguides 208*a-b* may have identical lengths, and the first and second looped waveguides 216*a-b* may have identical lengths. The similar or substantially identical continuous light beams are combined at the 2*2 optical coupler 206 to form the modulated optical signal 218, which is subsequently output on or to the second connecting waveguide 205*b* (e.g., an optical fiber connected to an optical network).

A Second Exemplary Optical Modulator Including an Optical Circulator

Figure 3:
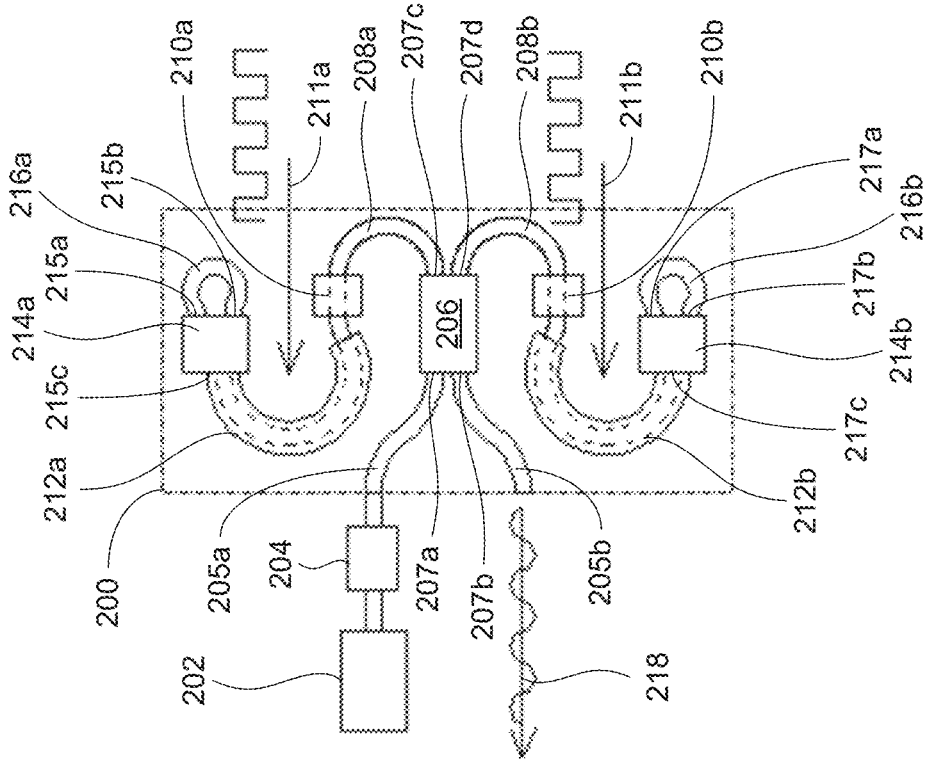
FIG. 3 shows an exemplary optical modulator including a 1*2 optical coupler and an optical circulator in accordance with one or more embodiments of the present invention.

FIG. 3 shows an exemplary optical modulator 300 including a connecting waveguide 305, a 1*2 optical coupler 306, first and second waveguides 308*a-b*, first and second low-speed phase shifters 310*a-b*, first and second high-speed phase shifters 312*a-b*, first and second 1*2 optical couplers 314*a-b*, and first and second looped waveguides 316*a-b*. Except for the connecting waveguide 305 and the 1*2 optical coupler 306, the components of the optical modulator 300 may be the same as or similar to the identically-named components of the optical modulator 200 (FIG. 2) in form and/or function.

FIG. 3 also shows a laser source 302 and an optical circulator 304. The laser diode 302 may be the same as or similar to the laser diode 202 described with respect to FIG. 2. The optical modulator 300 modulates a continuous light beam emitted from the laser diode 302 and outputs or generates a modulated optical signal 318.

The optical circulator 304 has at least first, second and third ports 303*a-c*. The first port 303*a* of the optical circulator 304 may be (or is configured to be) optically coupled to the source of the continuous light beam (the laser diode 302). The second port 303*b* of the optical circulator 304 may be optically coupled to the 1*2 optical coupler 306 (e.g., at the $m^{th}$ or 1 port). The third port 303*c* of the optical circulator 304 may be (or is configured to be) optically coupled to an optical fiber (e.g., for transmission in an optical network). The optical circulator 304 is configured to (i) direct or guide the continuous light beam from the first port 303*a* to the second port 303*b* and (ii) direct or guide the modulated optical signal 318 from the second port 303*b* to the third port 303*c*.

After the continuous light beam passes through the second port 303*b* of the optical circulator 304, the beam passes through the connecting waveguide 305 and enters the 1*2 optical coupler 306 through the "1" or "m" port 307*c*. The 1*2 optical coupler 306 splits the continuous beam into two similar or substantially identical continuous light beams, similarly or identically to the 2*2 optical coupler 206 described with respect to FIG. 2. Each of the similar or substantially identical continuous light beams are output from a corresponding one of the n ports 307*a-b* of the 1*2 optical coupler 306 to the waveguides 308*a-b*, where they travel along an optical path identical or substantially identical to the optical paths described with respect to FIG. 2. However, in contrast to the optical modulator 200 in FIG. 2, the similar or substantially identical continuous light beams may exit the n ports of the 1*n optical coupler 306 in the optical modulator 300 in FIG. 3 with the same phase.

Each of the light beams pass through the low-speed phase shifters 310*a-b* and the high-speed phase shifters 312*a-b*, and one or both of the similar or substantially identical continuous light beams may be phase shifted by the low-speed phase shifters 310*a-b* (e.g., using thermal energy or heat) and/or the high-speed phase shifters 312*a-b* (e.g., by the RF signals 311*a-b*), similarly or identically to the low-speed and high-speed phase shifters 210*a-b* and 212*a-b* described with respect to FIG. 2.

Each of the light beams in the waveguides 308*a-b* are returned to the optical coupler 306 by the loop mirrors (e.g., respectively comprising the 1*2 optical couplers 314*a-b* and the looped waveguides 316*a-b*). Each of the returned light beams may be additionally phase-shifted by the low-speed phase shifters 310*a-b* and/or the high-speed phase shifters 312*-a-b*, similarly or identically to the optical modulator 200 described with respect to FIG. 2. The returned light beams enter the 1*2 optical coupler 306 through ports 307*a-b*. The 1*2 optical coupler 306 combines the returned light beams from the waveguides 308*a-b* to form the modulated optical signal 318. Instead of the modulated optical signal 318 being output from a connecting waveguide 205*b* optically coupled to the 2*2 optical coupler 206 as shown in FIG. 2, the modulated optical signal 318 is output from the third port 303*c* of the optical circulator 304 (but generally onto an output waveguide or optical fiber).

A First Exemplary Compound Optical Modulator

Figure 4:
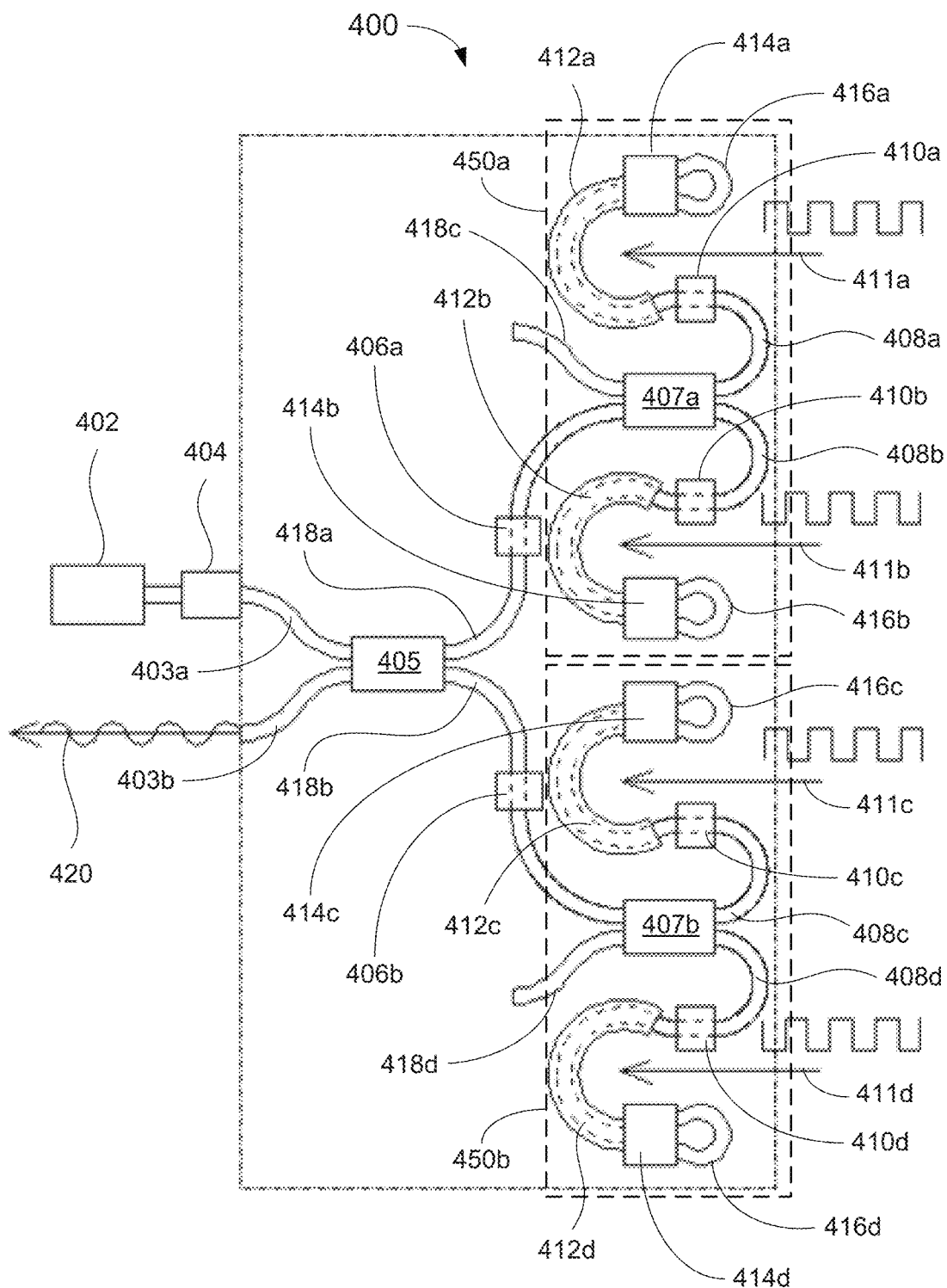
FIG. 4 shows an exemplary compound optical modulator including in-phase and quadrature optical modulators coupled to a 2*2 optical coupler in accordance with one or more embodiments of the present invention.

FIG. 4 shows an exemplary compound optical modulator 400, including an in-phase optical modulator 450*a* and a quadrature optical modulator 450*b*. The compound optical modulator 400 modulates and outputs a compound modulated optical signal 420, comprising an in-phase optical signal and a quadrature optical signal. The compound optical modulator 400 includes an input waveguide 403*a*, an output waveguide (e.g., optical fiber) 403*b*, a third 2*2 optical coupler 405, first and second connecting waveguides 418*a*-

*b*, an in-phase phase shifter 406*a*, a quadrature phase shifter 406*b*, 2*2 optical couplers 407*a-b*, waveguides 408*a-d*, low-speed phase shifters 410*a-d*, high-speed phase shifters 412*a-d*, 1*2 optical couplers 414*a-d*, and loop waveguides 416*a-d*. Also shown in FIG. 4 are a laser diode 402 and an optical isolator 404. The in-phase modulator 450*a* includes the 2*2 optical coupler 407*a*, the waveguides 408*a-b*, the low-speed phaser shifters 410*a-b*, the high-speed phase shifters 412*a-b*, the 1*2 optical couplers 414*a-b*, and the looped waveguides 416*a-b*. The quadrature modulator 450*b* includes the 2*2 optical coupler 407*b*, the waveguides 408*c-d*, the low-speed phaser shifters 410*c-d*, the high-speed phase shifters 412-*d*, the 1*2 optical couplers 414*c-d*, and the looped waveguides 416*c-d*. Each of the in-phase and quadrature modulators 450*a-b* may be the same or substantially the same as the optical modulator 200 in FIG. 2.

The in-phase modulator 450*a* is configured to provide or generate one or more modulated in-phase optical signals, and the quadrature modulator 450*b* is configured to provide or generate one or more modulated quadrature optical signals. The modulated in-phase and quadrature optical signals may differ in phase, typically by a predetermined amount (e.g., [2n−1]*90° or [2n−1]π/2, where n is an integer of 1 or more). However, the compound modulated optical signal 420 is not limited to in-phase and quadrature optical signals, and can comprise any optical signals that can be separated after being combined (e.g., two or more signals having at least one property orthogonal to the other signal[s]). Thus, in an alternative embodiment, the modulators 450*a-b* may generate optical signals that differ in polarization angle, typically by a predetermined amount (e.g., 90°), in which case each of the optical paths including the modulators 450*a-b* and/or the waveguides 418*a-b* may further comprise a polarizer and/or a waveplate (not shown) configured to rotate the light in the corresponding waveguide (e.g., by an amount resulting in a 90° difference in the polarization angles of the modulated optical signals).

The components of the optical modulator 400 may be the same as or similar in form and function to the identically-named components of the optical modulators 200 and 300 in FIGS. 2-3. The laser diode 402 and the optical isolator 404 may be the same as or similar in form and function to the laser diode 202 and optical isolator 204 in FIG. 2.

The third 2*2 optical coupler 405 is configured to split the continuous light beam emitted by the laser diode 402 into two similar or substantially identical continuous light beams. The first connecting waveguide 418*a* may be configured to (i) provide one of the similar or substantially identical continuous light beams to the 2*2 optical coupler 407*a* in the in-phase optical modulator 450*a* and/or (ii) receive the modulated in-phase optical signal from the in-phase optical modulator 450*a*. The second connecting waveguide 418*b* may be configured to (i) provide the other of the similar or substantially identical continuous light beams to the 2*2 optical coupler 407*b* in the quadrature optical modulator 450*b* and/or (ii) receive a modulated quadrature optical signal from the quadrature optical modulator 450*b*. The 2*2 optical coupler 405 may be configured to (i) receive the continuous light beam in a first one of its m ports from the waveguide 403*a* and the laser source 402, (ii) receive the modulated in-phase optical signal from the first connecting waveguide 418*a* and the modulated quadrature optical signal from the second connecting waveguide 418*b* in first and second ones of its n ports, respectively, and/or (ii) combine the modulated in-phase optical signal (i.e., from the in-phase optical modulator 450*a*) and the modulated quadrature optical signal to form the compound modulated optical signal 420.

The in-phase and quadrature phase shifters 406*a-b* may be low-speed (e.g., thermal) phase shifters, as described herein. The in-phase phase shifter 406*a* may be coupled to the first connecting waveguide 418*a* and may be configured to shift a phase of the substantially identical copy of the continuous light beam and the modulated in-phase optical signal in the first connecting waveguide 418*a* in response to a first stimulus. The quadrature phase shifter 406*b* may be coupled to the second connecting waveguide 418*b* and may be configured to shift a phase of the substantially identical copy of the continuous light beam and the modulated quadrature optical signal in the second connecting waveguide 418*b* in response to a second stimulus. The output waveguide 403*b* is coupled to second one of the m ports of the 2*2 optical coupler 405, and the 2*2 optical coupler 405 is configured to direct, guide or output the compound modulated optical signal 420 to the output waveguide 403*b*.

In some embodiments, the optical coupler 405 may be replaced by a 1*2 optical coupler, and a modulated laser including the compound optical modulator 400 may further comprise an optical circulator (identical or substantially identical to the optical circulator 304 shown in FIG. 3) having at least first, second and third ports. The first port is configured to be optically coupled to a source of the continuous light beam (the laser diode 402), the second port is configured to be optically coupled to the optical coupler 405, and the third port is configured to be optically coupled to an output waveguide. The optical circulator may be configured to (i) direct or guide the continuous light beam from the first port to the second port and (ii) direct or guide the compound modulated optical signal 420 from the second port to the third port.

Each of the similar or substantially identical continuous light beams are split by the optical couplers 407*a-b* into another set of similar or substantially identical continuous light beams (hereinafter "twice-split light beams"). Each of the twice-split light beams travels through the respective waveguides 408*a-d*, the low-speed phaser shifters 410*a-d*, the high-speed phase shifters 412*a-d*, and the loop mirrors (each respectively comprising the 1*2 couplers 414*a-d* and the looped waveguides 416*a-d*) in the same or substantially the same way as in the optical modulators 200 and 300 of FIGS. 2-3. However, the modulated in-phase and quadrature optical signals may have a predetermined phase difference as a result of the phase shifters 406*a-b* shifting the phase of the similar or substantially identical continuous light beams by different amounts. Alternatively or additionally, the phase shifters 410*a-d* and/or 412*a-d* in the in-phase and quadrature optical modulators 450*a-b* may also shift the phase of the modulated in-phase and quadrature optical signals by different amounts, in addition to modulating the optical signals as described herein. For example, the RF signals 411*c-d* may cause the high-speed phase shifters 412*c-d* to change the phase of the twice-split light beams in the waveguides 408*c-d* by 90° relative to the twice-split light beams in the waveguides 408*a-b*, which are not further phase-shifted by the high-speed phase shifters 412*a-b* (i.e., other than as needed for modulation of the in-phase optical signal). In some embodiments, the 2*2 optical coupler 407*a* may be configured to output part or all of the modulated in-phase optical signal at the second m port thereof onto an output waveguide or optical fiber 418*c*, and/or the 2*2 optical coupler 407*b* may be configured to output part or all of the modulated quadrature optical signal at the second m port thereof onto another output waveguide or optical fiber 418*d*.

A Second Exemplary Compound Optical Modulator

Figure 5:
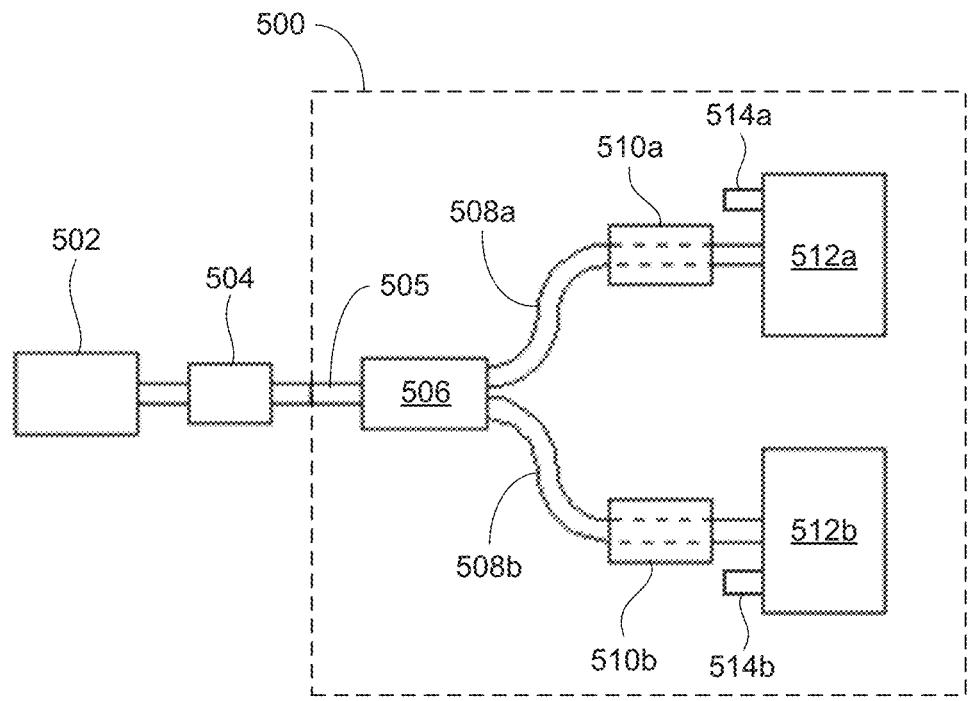
FIG. 5 shows an exemplary compound optical modulator including a 1*2 optical coupler in accordance with one or more embodiments of the present invention.

FIG. 5 shows an exemplary compound optical modulator 500 including an input waveguide 505, a 1*2 optical coupler 506, connecting waveguides 508a-b, low-speed phase shifters 510a-b, optical modulators 512a-b, and output waveguides 514a-b. Also shown are a laser diode 502 and an optical isolator 504 that may be the same as or similar to the laser diode 202 and optical isolator 204 shown in FIG. 2. Each of the optical modulators 512a-b may be the same as or similar to the optical modulators 200 and 300 (FIGS. 2-3) in form and/or function. Thus, each of the optical modulators 512a-b may include at least a 1*2 or 2*2 optical coupler, first and second waveguides, a low-speed phase shifter and a high-speed phase shifter coupled to at least one of the first and second waveguides, and first and second loop mirrors, each comprising a 1*2 optical coupler and a looped waveguide. However, each of the optical modulators 512a-b has a respective output 514a-b (e.g., a waveguide or optical fiber) for the modulated optical signal generated by the optical modulator 512a or 512b.

In essence, the modulated laser system including the laser diode 502, the optical isolator 504, and the optical modulators 512a-b is a system in which one laser 502 drives two modulators 512a and 512b. Thus, the optical modulators 512a-b may operate independently from each other and generate completely different optical data signals, although the wavelength of each signal is the same or substantially the same. Relatively powerful lasers in which the output power routinely exceeds the maximum power limits of typical optical networks may be particularly useful in the compound optical modulator 500.

The continuous light beam emitted by the laser diode 502 may pass through the optical isolator 504 and input waveguide 505 and enter the 1*2 optical coupler 506, where the continuous light beam is split into two similar or substantially identical light beams. One of the similar or substantially identical light beams passes through the connecting waveguide 508a and low-speed phase shifter 510a, and the other of the similar or substantially identical light beams passes through the connecting waveguide 508b and the low-speed phase shifter 510b. The low-speed phase shifters 510a-b may adjust the phase of one or both of the optical signals passing through the respective connecting waveguides 508a-b (e.g., to ensure that timing of transitions in the modulated optical signals complies with any applicable specifications). Alternatively or additionally, the low-speed phase shifters 510a-b may shift the phase of light reflected back towards the 1*2 optical coupler 506 (and thus that could be further reflected back into the laser 502) so that the reflected light in one of the waveguides 508a-b destructively interferes with the reflected light in the other of the waveguides 508a-b when the reflected light returns to the 1*2 optical coupler 506. This destructive interference reduces or substantially eliminates the amount or intensity of light reflected back towards the laser 502, thereby reducing or eliminating requirements for the optical isolator 504. It is within the abilities of one skilled in the art to measure the amount of light reflected back to the laser diode 502, the input waveguide 505 and/or the 1*2 optical coupler 506 and determine the phase shift to be applied by each of the low-speed phase shifters 510a-b to result in destructive interference of the light reflected through each of the waveguides 508a-b at the 1*2 optical coupler 506.

Alternatively, in some embodiments, one of the optical modulators 512a-b may be an in-phase modulator and the other may be a quadrature modulator, such as the optical modulators 450a-b described with respect to FIG. 4. In such embodiments, the low-speed phase shifters 510a-b may adjust the phase of one or both of the optical signals passing through the respective connecting waveguides 508a-b so that there is a predetermined phase difference between the optical signals, as described herein.

After being modulated by the optical modulators 512a-b, the modulated light beams are respectively output on the output waveguides or fibers 514a-b. Thus, instead of the two modulated optical signals being combined into one compound modulated optical signal (see, e.g., the optical coupler 406 in FIG. 4), the two modulated optical signals are separately output with a maximum amplitude equal to about half of that of the continuous light beam emitted by the laser diode 502.

It is within the abilities of one skilled in the art to create more complex systems in which one or more additional 1*2 couplers similar or identical to the optical coupler 506 and additional waveguides similar or identical to the connecting waveguides 508a-b are placed in series with the optical coupler 506 and one of the connecting waveguides 508a-b to drive additional modulators. The number of modulators in the modulated laser system shown in FIG. 5 is limited only by the output power of the laser 502 and the requirements or specifications for the modulated optical signals on the output waveguides or fibers 514a-b.

A Third Exemplary Compound Optical Modulator

Figure 6:
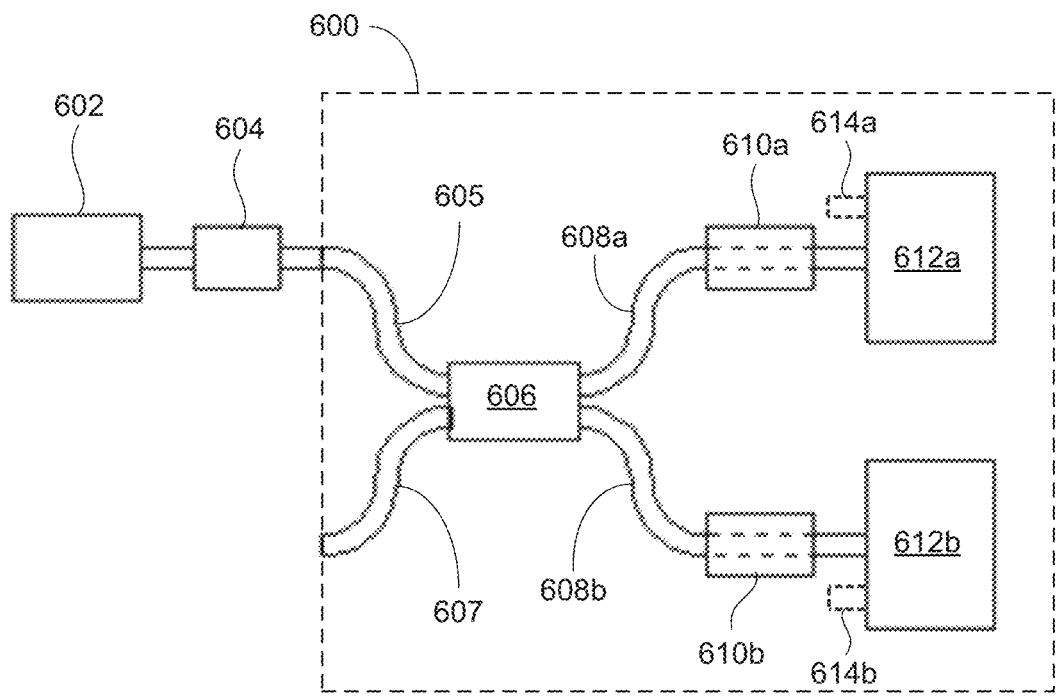
FIG. 6 shows an exemplary compound optical modulator including a 2*2 optical coupler in accordance with one or more embodiments of the present invention.

FIG. 6 shows an exemplary compound optical modulator 600 including an input waveguide 605, a 2*2 optical coupler 606, an output waveguide 607, connecting waveguides 608a-b, low-speed phase shifters 610a-b, optical modulators 612a-b, and optional output waveguides 614a-b. Also shown are a laser diode 602 and an optical isolator 604 that may be the same as or similar to the laser diode 202 and optical isolator 204 shown in FIG. 2. Each of the optical modulators 612a-b may be the same as or similar to the optical modulators 200 and/or 300 (FIGS. 2-3) in form and/or function. Thus, the compound optical modulator 600 functions primarily to output modulated optical signals onto the output waveguides 614a and 614b. In the compound optical modulator 600, like the compound optical modulator 500 in FIG. 5, the low-speed phase shifters 610a-b are configured to shift the phase of light reflected back towards the 2*2 optical coupler 606 so that the reflected light in one of the waveguides 608a-b destructively interferes with the reflected light in the other of the waveguides 608a-b when it returns to the 2*2 optical coupler 606. In addition, the 2*2 optical coupler 606 may be further configured to direct any remaining reflected light (e.g., after combination by destructive interference in the 2*2 optical coupler 606) to the output waveguide 607 and minimize the portion or amount of light that returns to the laser diode 602. This has the advantage of reducing or eliminating the requirements for the optical isolator 604 and/or extending the lifetime of the optical isolator 604 and laser diode 602. In some cases, the optical isolator 604 may be omitted.

Like the modulated laser system in FIG. 5, the modulated laser system including the laser diode 602, the optical isolator 604, and the optical modulators 612a-b in FIG. 6 is a system in which one laser 602 drives two modulators 612a and 612b. Thus, the continuous light beam emitted by the laser diode 602 may pass through the optical isolator 604 and input waveguide 605 and enter the 2*2 optical coupler 606, where the continuous light beam is split into two similar or substantially identical light beams. One of the similar or substantially identical light beams passes through the connecting waveguide 608a and low-speed phase shifter 610a, and the other of the similar or substantially identical light beams passes through the connecting waveguide 608b and the low-speed phase shifter 610b, similarly or identically to the system shown in FIG. 5. After being modulated by the optical modulators 612a-b, the modulated light beams are respectively output onto the output waveguides 614a-b.

However, any light returned to the connecting waveguides 608a-b (e.g., by reflection) by or through the optical modulators 612a-b is phase-shifted again by the low-speed phase shifters 610a-b and is destructively combined in the 2*2 optical coupler 606. While one can measure the amount of light reflected back to the laser diode 602, the input waveguide 605 and/or the 2*2 optical coupler 606 to determine the phase shift to be applied by each of the low-speed phase shifters 610a-b to result in destructive interference of the reflected light at the 2*2 optical coupler 606, it may not be necessary to do so when the residual reflected light is output onto the waveguide/fiber 607 connected or coupled to the second one of the m ports of the optical coupler 606. Instead, the phase shift to be applied by each of the low-speed phase shifters 610a-b may be estimated, determined empirically, or determined statistically from empirical reflection data in other (and optionally identical and/or similar) optical modulators. Thus, the compound optical modulator 600 is configured to protect the laser 602 from reflected or returned light.

A Further Exemplary Optical Modulator

Figure 7A:
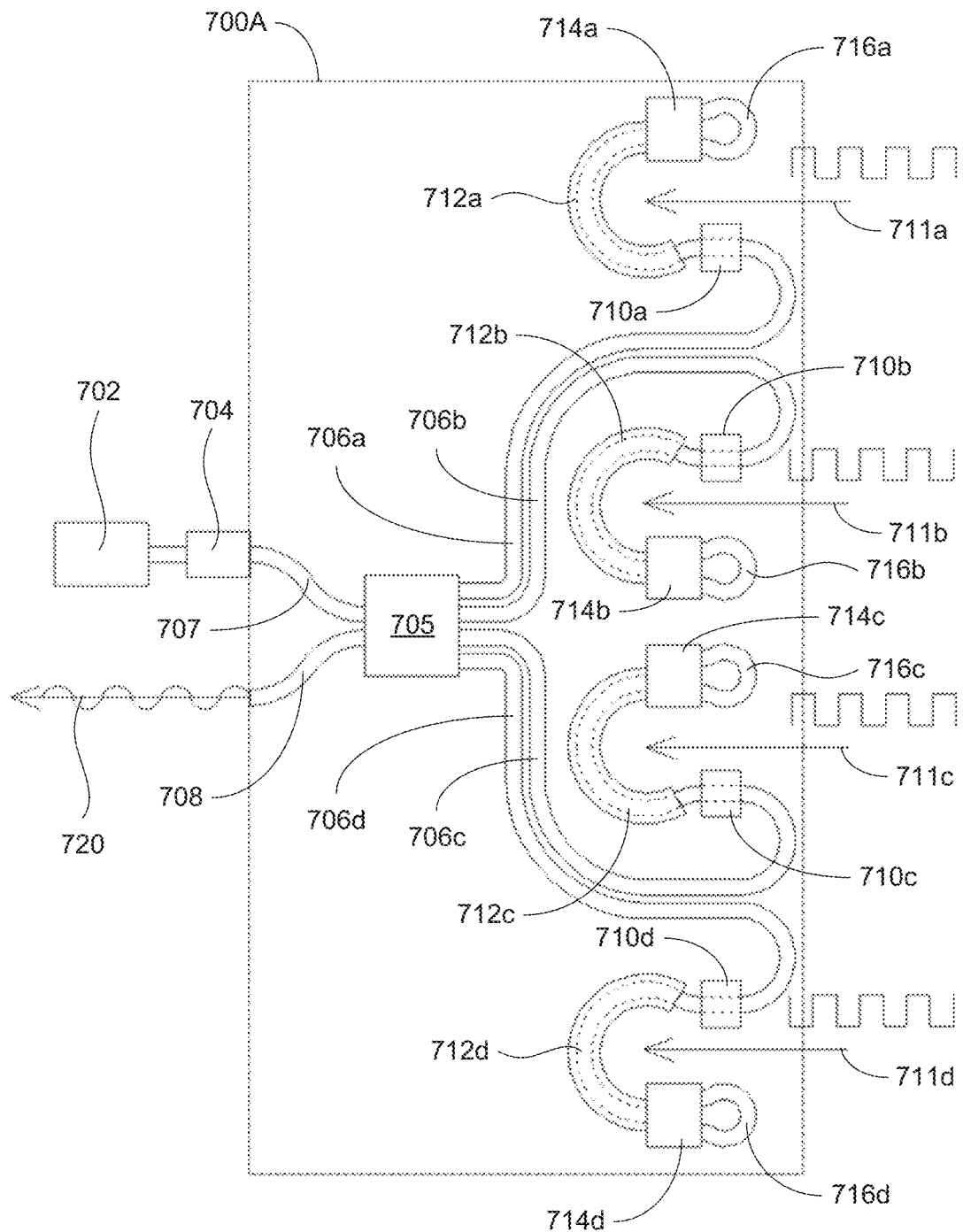
FIG. 7A shows an exemplary compound optical modulator including a 2*4 optical coupler in accordance with one or more embodiments of the present invention.

FIG. 7A shows an exemplary optical modulator 700A including an a 2*4 optical coupler 705, phase-shifting waveguides 706a-d, input waveguide 707, output waveguide 708, low-speed phase shifters 710a-d, high-speed phase shifters 712a-d, 1*2 optical couplers 714a-d, and looped waveguides 716a-d. Also shown is a modulated laser system comprising a laser diode 702, an optical isolator 704 and the optical modulator 700A. The laser diode 702 and an optical isolator 704 may be the same as or similar to the laser diode 202 and optical isolator 204 shown in FIG. 2. The components of the optical modulator 700A may be the same as or similar to the identically named components of the optical modulators 200 and 300 (FIGS. 2-3) in form and/or function. For example, the 2*4 optical coupler 705 is structurally and functionally similar to the 2*2 optical coupler 206 in FIG. 2, except that it splits the continuous light beam from the laser diode 702 and the input waveguide 707 into four similar or substantially identical light beams (each having an amplitude of about a quarter of the amplitude of the continuous light beam).

The four similar or substantially identical light beams then respectively pass through the phase-shifting waveguides 706a-d, to which the low-speed phase shifters 710a-d and the high-speed phase shifters 712a-d are respectively coupled. The high-speed phase shifters 712a-d shift the phase of the similar or substantially identical light beams in response to the respective RF signals 711a-d in the same or substantially the same manner as described herein with respect to one or more other embodiments. The four similar or substantially identical light beams (one, two or more of which may be phase-shifted) are respectively returned toward the 2*4 optical coupler 705 by the loop mirrors (i.e., the 1*2 optical couplers 714a-d and looped waveguides 716a-d). The four returned light beams are then combined or recombined in the 2*4 optical coupler 705 to form a modulated (e.g., "twice-combined") or compound modulated optical signal 720. The (compound) modulated optical signal 720 is then output on the output waveguide 708.

The modulator 700A can output a compound modulated optical signal (e.g., comprising modulated in-phase and quadrature optical signals) when two of the phase shifter pairs 710a-712a, 710b-712b, 710c-712c and 710d-712d generate a modulated in-phase optical signal and the other two phase shifter pairs generate a modulated quadrature optical signal. In such embodiments, the first and second phase shifter pairs 710a-712a and 710b-712b can generate one of the modulated in-phase and quadrature optical signals, and the third and fourth phase shifter pairs 710c-712c and 710d-712d can generate the other of the modulated in-phase and quadrature optical signals, or the first and fourth phase shifter pairs 710a-712a and 710d-712d can generate one of the modulated in-phase and quadrature optical signals, and the second and third phase shifter pairs 710b-712b and 710c-712c can generate the other signal. The latter arrangement may be preferred because an optical path including an outer waveguide (i.e., the first or fourth waveguide 706a or 706d) is more likely to match the length, the path geometry and the phase shifter configuration of the optical path including the other outer waveguide than an optical path including an inner waveguide (i.e., the second or third waveguide 706b or 706c), and an optical path including an inner waveguide is more likely to match the length, the path geometry and the phase shifter configuration of the optical path including the other inner waveguide than an optical path including an outer waveguide.

However, such paired optical path matching does not necessarily apply to a "twice-combined" modulated optical signal from the 2*4 optical coupler 705, as all four optical paths (i.e., including the first through fourth waveguides 706a-706d) should have at least matching lengths and phase shifter configurations. In generating the "twice-combined" modulated optical signal, the 2*4 optical coupler 705 can be configured to combine the returned modulated optical signals from the waveguides 706a-706d in any possible manner.

In a further alternative, the returned modulated optical signals from the waveguides 706a-706d may be combined by the 2*4 optical coupler 705 to create an optical data signal having up to five different states, even when each of the RF signals 711a-d has only two states (e.g., on and off). For example, when all four of the RF signals 711a-d have the same state (e.g., off), the modulated optical signal may have a first data value (e.g., a quinary data state of "4" or an equivalent thereto). When one of the RF signals 711a-d has one state (e.g., off) and the remaining three RF signals have the other state (e.g., on), the modulated optical signal may have a second data value (e.g., a quinary data state of "3" or an equivalent thereto). When two of the RF signals 711a-d have one state (e.g., off) and the remaining two RF signals have the other state (e.g., on), the modulated optical signal may have a third data value (e.g., a quinary data state of "2" or an equivalent thereto). When three of the RF signals 711a-d have one state and the remaining RF signal has the other state, the modulated optical signal may have a fourth data value (e.g., a quinary data state of "1" or an equivalent thereto), and when all four of the RF signals 711a-d have the same state opposite from that of the first data value (e.g., on), the modulated optical signal may have a fifth data value (e.g., a quinary data state of "0" or an equivalent thereto).

An optimal configuration for the modulator 700A that outputs an optical data signal having more than two states is one in which (i) all returned optical signals in the waveguides 706a-d have same power and same phase when returning to the 4 ports of the 2*4 optical coupler 705 to form a modulated optical signal 720 having a first data state (e.g., "0" or "z" when the data has z possible states), (ii) the phase shift corresponding to the difference between the first data state 0 and the adjacent data state (e.g., "1" or "z−1")

is small, and (iii) the output signal 720 is phase-modulated. A phase shift of x may be considered small when it is in the range in which $\sin(x) \approx x$ (e.g., $\pi/5$, $\pi/6$, or less).

It is within the level of ordinary skill in the art to implement more complex systems in which the modulated optical signal can have more than 5 states (e.g., 10, 15, or more states) by using RF signals having p possible states, where p is an integer of three or more. Alternatively, a 16-state or "4-bit" system can be designed in which each of the RF signals 711a-d has only two states (e.g., an "on" state and an "off" state). A first state for each of the RF signals 711a-d (e.g., the "off" state) can have the same value (e.g., 0 V). However, the second state for each of the RF signals 711a-d has a different value. For example, one RF signal (e.g., 711a) can have a second state at $V_{max}$, and thus function as an MSB for the "4-bit" system. Another RF signal (e.g., 711b) can have a second state at $3V_{max}/4$, a third RF signal (e.g., 711c) can have a second state at $V_{max}/2$, and the remaining RF signal (e.g., 711d) can have a second state at $V_{max}/4$, thus functioning as an LSB for the "4-bit" system. This leads to 16 possible states, and a system and technique for communicating hexadecimal data.

An Alternative Further Exemplary Optical Modulator

Figure 7B:
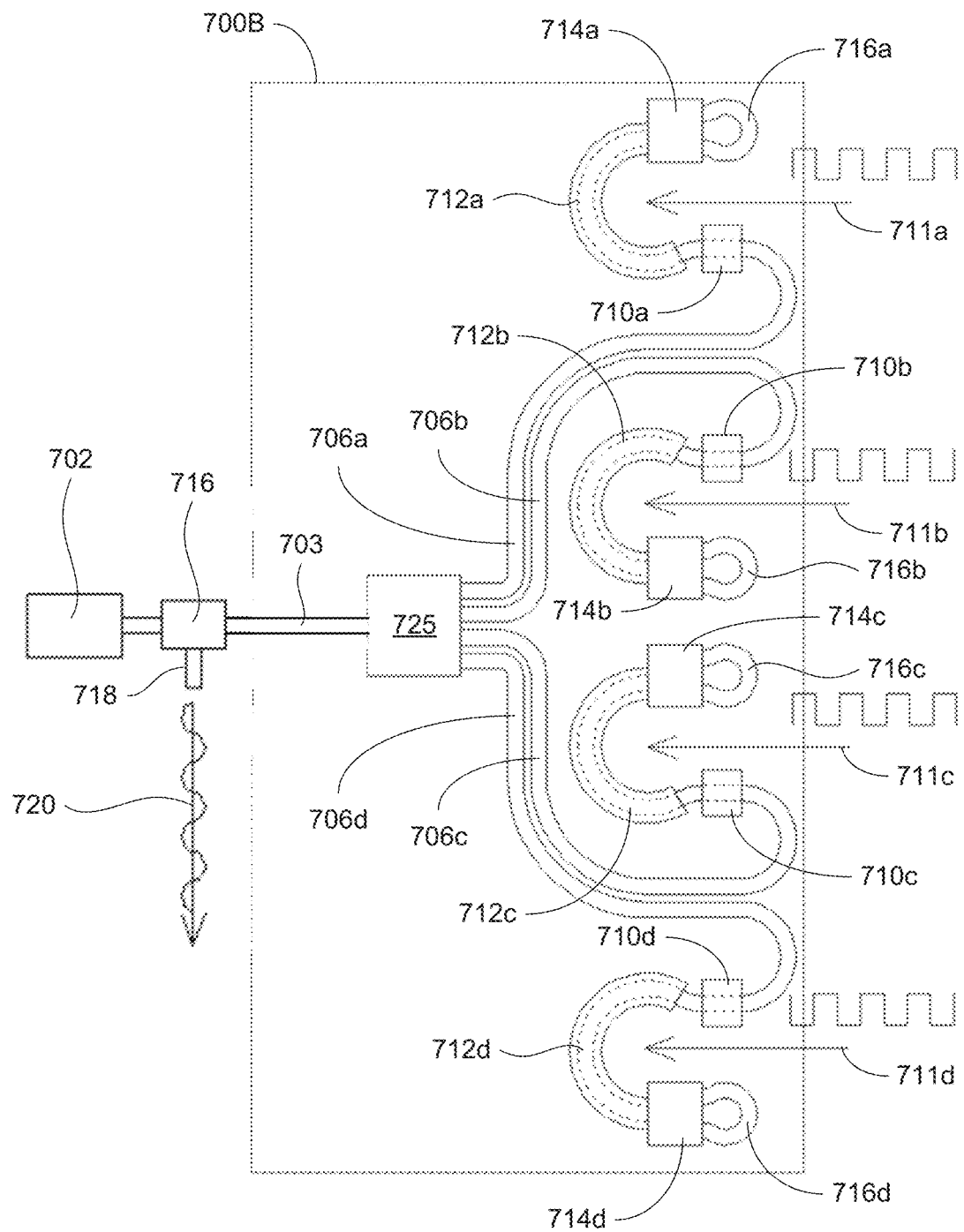
FIG. 7B shows an exemplary compound optical modulator including a 1*4 optical coupler and an optical circulator in accordance with one or more embodiments of the present invention.

FIG. 7B shows another exemplary optical modulator 700B that is similar to the optical modulator 700A in FIG. 7A, except that the optical isolator 704 and the 2*4 optical coupler 705 are replaced with an optical circulator 716 and a 1*4 optical coupler 725. The input and output waveguides 707 and 708 in FIG. 7A are essentially relabeled as connecting waveguide 703 and output waveguide 718 in FIG. 7B, respectively, although they may be structurally and/or functionally the same as or similar to the input and output waveguides 707 and 708.

The optical circulator 716 may be the same or substantially the same as the optical circulator 304 (FIG. 3). Thus, the optical circulator 716 may be configured to (i) direct or guide the continuous light beam from its first port (facing the laser diode 702) to its second port (facing the 1*4 optical coupler 725) and (ii) direct or guide the modulated optical signal 720 from its second port to its third port.

Operationally, the connecting waveguide 703 transports the continuous light beam from the second port of the optical circulator 716 to the 1*4 optical coupler 725. The 1*4 optical coupler 725 then splits the continuous light beam into four similar or substantially identical light beams, similarly or identically to the 2*4 optical coupler 705. The similar or substantially identical light beams in the phase-shifting waveguides 706a-d are respectively modulated by the low-speed and high-speed phase shifters 710a-d and 712a-d and returned to the 1*4 optical coupler 725 by the 1*2 optical couplers 714a-d and looped waveguides 716a-d in the same manner as discussed with respect to FIG. 7A. The 1*4 optical coupler 725 of FIG. 7B combines the four returned light beams (one, two or more of which may be phase-shifted) to form a modulated or compound modulated optical signal 720 in the same manner as the 2*4 optical coupler 705 of FIG. 7A, then outputs the (compound) modulated optical signal 720 onto the output waveguide 718.

A Method of Modulating a Continuous Light Beam

Figure 8:
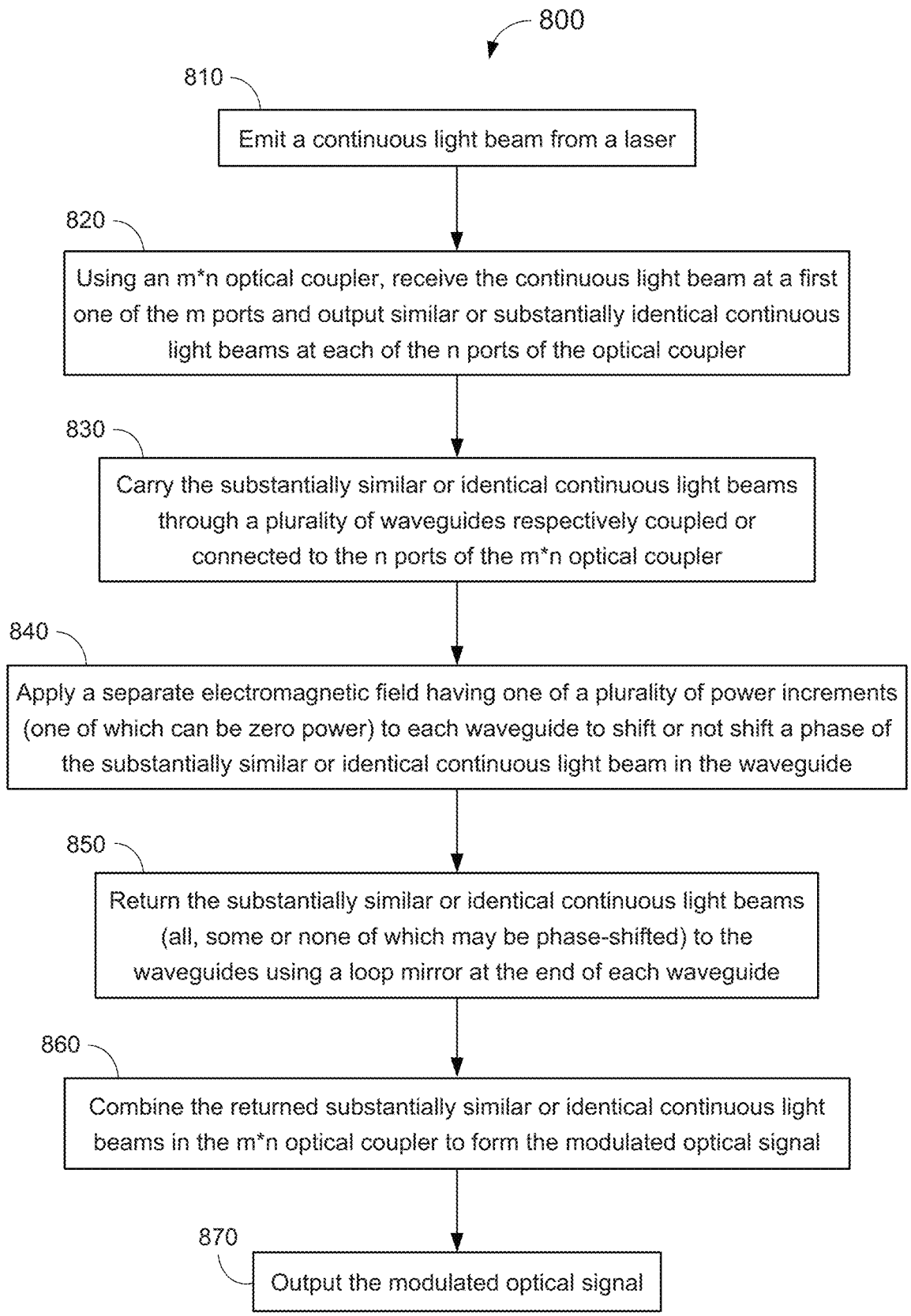
FIG. 8 is a flow chart for an exemplary method of modulating a continuous light beam in accordance with one or more embodiments of the present invention.

FIG. 8 is a flowchart 800 showing an exemplary method of modulating a continuous light beam and/or generating a modulated optical signal. For example, at 810, a continuous light beam is emitted from a laser (e.g., a laser diode). The laser may be the same or substantially the same as the laser 202 in FIG. 2 or the laser 302 in FIG. 3, for example. The continuous light beam emitted by the laser may pass through an optical isolator or an optical circulator, as described herein.

At 820, the continuous light beam is received at a first one of the m ports of an m*n optical coupler. The m*n optical coupler then outputs n similar or substantially identical continuous light beams, one at each of the n ports of the m*n optical coupler. Thus, the method may comprise splitting the continuous light beam nonselectively into n similar or substantially identical continuous light beams. Each of the similar or substantially identical continuous light beams may have a similar or substantially identical amplitude, which may be about 1/n of the amplitude of the received continuous light beam.

The m*n optical coupler may be as described herein for any of the present optical modulators. Generally, "m" and "n" describe ports on opposite ends or sides of the optical coupler, where the "m" ports are on the side or end of the optical coupler configured to receive the continuous light beam from the laser, and the "n" ports are on the side or end of the optical coupler that communicates with the waveguides to which the phase shifter(s) is/are coupled. In general, m is an integer of at least one (e.g., 1 or 2), and n is an integer of at least two (e.g., 2, 4, or 8).

The n similar or substantially identical continuous light beams are output onto a plurality of waveguides, which carry the similar or substantially identical continuous light beams at 830. The waveguides are respectively coupled or connected to the n ports of the m*n optical coupler, and may comprise an optical fiber, as described herein. Generally, each waveguide is coupled or connected to a unique one of the n ports. Therefore, in most embodiments, the number of waveguides is n.

One or more of the waveguides may be coupled to a low-speed phase shifter as described herein, in which case the method may further comprise applying a variable amount of thermal energy (heat) to one or more of the waveguides to shift a phase of the substantially similar or identical continuous light beam in the one or more waveguides. Typically, each waveguide is coupled to a unique low-speed phase shifter that is identical or substantially identical to the low-speed phase shifter(s) coupled to the other waveguide(s). However, not all of the low-speed phase shifters necessarily apply thermal energy to the corresponding waveguide.

At 840, a separate electromagnetic field is applied to each waveguide to shift or not shift a phase of the substantially similar or identical continuous light beam in that waveguide, as described herein. Each electromagnetic field, which may be or comprise an RF signal, has one of a plurality of power or voltage increments. One of the increments may be zero (e.g., 0 V). In some embodiments, the increments comprise zero and maximum (e.g., $V_{max}$). In further embodiments, the increments further comprise one or more attenuated increments (e.g., $V_{max}/2$, $V_{max}/3$, $2V_{max}/3$, etc.). Therefore, the method may further comprise applying a first electromagnetic field having a first power or voltage increment to a first high-speed phase shifter coupled to a first waveguide, and applying a second electromagnetic field having a second power or voltage increment to a second high-speed phase shifter coupled to a second waveguide, where the first and second electromagnetic fields, the first and second high-speed phase shifters, and the first and second waveguides are different, but the first and second power or voltage increments may be the same or different. However, in some embodiments, the first and second power or voltage increments may be the same at no more than one value of the increments. The phase(s) of the substantially similar or identical continuous light beam(s) may be shifted such that there is a predetermined phase difference (e.g., 0°, 45°, 90°, etc.) between at least two of the substantially similar or identical continuous light beams. In some embodiments that include more than two substantially similar or identical continuous light beams and corresponding waveguides, the phase of at least one of the substantially similar or identical continuous light beams is shifted such that there is a predetermined phase difference between each of the substantially similar or identical continuous light beams.

At 850, the substantially similar or identical continuous light beams (at least one of which may be phase-shifted) are returned to the waveguides using a loop mirror at the end of each waveguide opposite from the end coupled or connected to the m*n optical coupler. The loop mirror may comprise a 1*2 optical coupler and a looped waveguide as described herein. Therefore, the method may further comprise returning or reversing a direction of each substantially similar or identical continuous light beam to or in the corresponding waveguide by passing the signal through an optical coupler, a looped waveguide connected to two ports of the optical coupler, and back through the optical coupler to the original waveguide.

In addition, any of the phase shifters that shifted the phase of a corresponding substantially similar or identical continuous light beam at 830 and 840 will do so again when the substantially similar or identical continuous light beam is returned through the waveguide by the loop mirror. This effectively doubles the efficiency of the phase shifters. Accordingly, the method may further comprise applying thermal energy or an electromagnetic field to the returned substantially similar or identical continuous light beam in any waveguide to which the thermal energy or an electromagnetic field was applied to shift the (original) substantially similar or identical continuous light beam.

At 860, the returned substantially similar or identical continuous light beams are combined or recombined in the m*n optical coupler to form the modulated optical signal as described herein. In the case of a compound optical modulator, the method may further comprise (1) combining two or more returned substantially similar or identical continuous light beams from an in-phase optical modulator to produce a modulated in-phase optical signal and combining two or more other returned substantially similar or identical continuous light beams from a quadrature optical modulator to produce a modulated quadrature optical signal, and/or (2) combining four or more returned substantially similar or identical continuous light beams from two or more optical modulators (e.g., to produce a "twice-combined" modulated optical signal as described herein or a modulated optical data signal in which the data can have more than two [e.g., 5 or more] states). The modulated optical signal is output (e.g., to an optical network, an optical data storage system, etc.) at 870. Alternatively, the compound modulator may output separate modulated optical signals onto different output waveguides or optical fibers, respectively coupled or connected to the different optical modulator units in the compound optical modulator.

An Exemplary Method of Manufacturing an Optical Modulator

The present optical modulator is advantageously implemented as one or more photonic integrated circuits (PICs). For example, some or all of the components of the present optical modulator may be formed in a silicon PIC (Si PIC). Accordingly, the present invention also relates to a method of manufacturing an optical modulator comprising forming an m*n optical coupler, first and second waveguides, at least a first phase shifter, and first and second loop mirrors in one or more photonic integrated circuits, such that the first and second waveguides are respectively optically coupled or connected to first and second ones of the n ports of the m*n optical coupler, the first phase shifter is coupled to the first waveguide, and the first and second loop mirrors are optically connected to respective ends of the first and second waveguides. In the present method of manufacturing, m is an integer of one or more, n is an integer of two or more, and the m*n optical coupler is configured to receive a continuous light beam at a first one of the m ports and output similar or substantially identical continuous light beams at the first and second ones of the n ports. Furthermore, the first phase shifter is configured to shift a phase of the similar or substantially identical continuous light beam in the first waveguide in a first applied electromagnetic field. In addition, the first and second loop mirrors are configured to return the similar or substantially identical continuous light beams to the first and second waveguides.

Preferably, as many of the components of the optical modulator are formed on a single PIC substrate or chip (e.g., a Si PIC chip) as possible. However, in most embodiments, the first and second waveguides and the first phase shifter are formed on a first PIC substrate. Referring now to FIGS. 9A-B, cross-sections of exemplary PIC chips 900 (FIG. 9A) and 900' (FIG. 9B) are shown. The exemplary PIC chips 900 and 900' include a silicon wafer substrate 910, an insulator layer 920, an n-doped silicon layer 930 or 930', a p-doped silicon layer 932 or 932', and an overlying dielectric layer 940. The exemplary PIC chip 900 in FIG. 9A includes a lateral p-n junction 933 and a vertical p-n junction 935, whereas the exemplary PIC chip 900' in FIG. 9B includes a lateral p-n junction 937.

The high-speed silicon photonics phase shifters can include the lateral p-n junction 937 or both the vertical p-n junction 935 and the lateral p-n junction 933. Typically, the cross-sectional area of the silicon waveguide 930 and 930' in the present optical modulator has a height of from 100 nm to 300 nm and a width of from 200 nm to 600 nm. The efficiency of the p-n junction-based phase shifter is roughly proportional to the width of the p-n junction (e.g., the height of the lateral p-n junction 937, or the combined height of the lateral p-n junction 933 and width of the vertical p-n junction 935). Thus, the vertical junction phase shifter 900 in FIG. 9A can have a higher efficiency than the lateral junction phase shifter 900' in FIG. 9B. According to simulations performed using a photonic simulation tool available from Lumerical® Inc. (Vancouver, British Columbia, Canada), a vertical junction phase shifter such as the vertical junction phase shifter 900 in FIG. 9A can be up to ~60% more efficient than a corresponding (i.e., otherwise identical) lateral junction phase shifter such as the lateral junction phase shifter 900' in FIG. 9B. A vertical junction phase shifter is advantageous for making phase shifters and waveguides having a size enabling a "lumped element" configuration and/or function.

In some respects, the processing steps to make the vertical junction phase shifter 900 in FIG. 9A and the lateral junction phase shifter 900' in FIG. 9B are similar, and in other respects, they are different. For example, both phase shifters can be made starting from a conventional silicon-on-insulator substrate. The silicon layer on the insulator layer 920 can first be implanted with a relatively low dose of an n-type dopant at a relatively high energy to form an n-doped silicon layer over the insulator layer 920. Thereafter, an etching mask may be formed on the n-doped silicon layer corresponding to the raised region 934, and the exposed n-doped silicon layer can be etched to form the raised region 934 and the n-doped silicon layer 930 shown in FIGS. 9A-B. The etching mask is then removed.

To form the vertical junction phase shifter 900 in FIG. 9A, after the raised region 934 is formed, an implant mask is formed over the etched part of n-doped silicon layer 930 shown in FIG. 9A, and the raised region 934 and the region of silicon layer corresponding to the p-doped silicon layer 932 is implanted with a relatively high dose of a p-type dopant, at a relatively low energy. This ensures that the implanted region is p-type, and that the p-type region extends only partially through the raised region 934. Following dopant activation, the p-n junction 933 is offset slightly from the corresponding vertical edge of the raised region 934, ensuring ohmic contact of the bulk p-doped silicon layer 932 with the portion thereof in the raised region 934. An angled implant of the p-type dopant can also ensure such an offset and ohmic contact.

To form the lateral junction phase shifter 900' in FIG. 9B, before the raised region 934 is formed, an implant mask is formed over the n-doped silicon layer corresponding to the n-doped silicon layer 930' shown in FIG. 9A, and part of the raised region 934 and the region of the silicon layer corresponding to the p-type silicon layer 932' is implanted with a relatively high dose of a p-type dopant, at an energy necessary to form the p-type silicon layer 932' throughout most or all of the silicon layer. The raised region 934 in FIG. 9B may be formed after activation of the dopant(s).

In various further embodiments, the m*n optical coupler may be formed on the first PIC or a separate second PIC, and the first and second loop mirrors may be independently formed on the first PIC or one or more third PICs. For alignment purposes, the first and second loop mirrors are preferably formed on the same PIC, but they may be formed on separate PICs.

In some embodiments, the first phase shifter and the first waveguide may be formed in a curve or arc configured to maintain a phase difference of the first applied electromagnetic field along the first phase shifter of less than $\pi/p$, wherein p is greater than or equal to 2 (and more ideally, greater than or equal to 5). Similarly, the curve or arc of the first phase shifter and the first waveguide may be such that the first phase shifter has a maximum dimension of ¼ of a wavelength of the radiation of the first electromagnetic field or less. As for embodiments of the optical modulator, the first phase shifter may comprise a first high-speed phase shifter, and the method may further comprise forming a first low-speed phase shifter in series with the first high-speed phase shifter (e.g., between the m*n optical coupler and either the first high-speed phase shifter or the first loop mirror).

In some embodiments, forming the first and second loop mirrors may comprise forming first and second 1*2 optical couplers and first and second looped waveguides in a single PIC or in first and second loop mirror PICs. The first and second 1*2 optical couplers are coupled to the corresponding first and second waveguides, and the first and second looped waveguides are respectively connected at one end to a first port of the 1*2 optical coupler and at an opposite end to a second port of the 1*2 optical coupler.

In some embodiments, the method further comprises forming a second phase shifter coupled to the second waveguide in the same PIC as the second waveguide. As for the present optical modulator, the second phase shifter may be configured to shift a phase of the substantially similar or identical continuous light beam in the second waveguide in a second applied electromagnetic field, and may be identical or substantially identical to the first phase shifter.

In some embodiments, the m*n optical coupler is a 2*2 coupler, and the method may further comprise forming a third waveguide in the same PIC as the m*n (2*2) optical coupler. The third waveguide is optically coupled or connected to a second one of the m ports of the m*n (2*2) optical coupler. As for the present optical modulator, the 2*2 optical coupler is configured to direct, guide or output the modulated optical signal to the third waveguide. In such embodiments, the method may further comprise forming a fourth waveguide in the same PIC as the 2*2 optical coupler and the third waveguide. The fourth waveguide may be optically coupled or connected to and/or configured to provide the continuous light beam to the first one of the m ports of the 2*2 optical coupler.

In other embodiments, the m*n optical coupler is a 1*2 optical coupler, and the method further comprises forming and/or optically connecting an optical circulator having at least first, second and third ports to the m*n (1*2) optical coupler. However, the optical circulator is generally formed on a separate substrate (e.g., PIC) from the 1*2 optical coupler. The second port of the optical circulator may be optically connectable to the m or one ("1") port of the 1*2 optical coupler. In such embodiments, the first port of the optical circulator may be optically connectable to a source of the continuous light beam, and the third port of the optical circulator may be optically connectable to an optical fiber (e.g., for transmission in an optical network).

In further embodiments, the method may further comprise forming the laser on or in the same chip (e.g., the same PIC substrate) as components of the optical modulator (e.g., the m*n optical coupler, the first and second waveguides, and at least the first phase shifter). Alternatively, the laser may be formed on or in a separate substrate from the optical modulator PIC. Making the laser on the same chip as the m*n optical coupler (and any intervening waveguide) can reduce reflections of the continuous light beam (e.g., from surfaces of the discrete devices in which the laser and optical modulator would otherwise be formed), thereby reducing or eliminating any need for the optical isolator (which, at this time, cannot be formed on the same substrate as the laser or the optical modulator). When the laser is formed on the same chip as a 2*2 optical coupler, an optical circulator can be avoided, and substantially all components of the modulatable laser (i.e., the laser and the optical modulator) can be integrated into or onto one chip or PIC substrate.

The RF circuit(s) (e.g., first and second RF drivers) configured to provide electrical signals to first and second RF emitters that respectively emit or broadcast the first and second electromagnetic fields) can also be formed on the same PIC as the first and (when present) second phase shifters. The monolithic integration of the RF circuit(s) or driver(s) and the photonic integrate circuit(s) can be performed using existing technology. However, in alternative embodiments, one or driver ICs may be placed or mounted side-by-side with the photonics IC (e.g., on the same substrate, such as a conventional printed circuit board [PCB]), or the driver IC(s) may be mounted on the optical modulator PIC or vice versa (i.e., the optical modulator PIC may be mounted on the driver IC[s], depending on their relative size). When the optical modulator PIC is mounted on more than one driver IC, the driver ICs are typically mounted on the same PCB prior to mounting the PIC thereon.

CONCLUSION/SUMMARY

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An optical modulator, comprising:
    a first m*n optical coupler comprising m ports at a first end and n ports at a second end, wherein m is an integer of one or more, n is an integer of two or more, and the first m*n optical coupler is configured to receive a continuous light beam at a first one of the m ports and output similar or substantially identical continuous light beams at each of the n ports;
    a first waveguide coupled or connected to a first one of the n ports of the first m*n optical coupler;
    a first phase shifter coupled to the first waveguide and configured to shift a phase of the similar or substantially identical continuous light beam in the first waveguide in a first applied electromagnetic field;
    a first loop mirror at an end of the first waveguide, configured to return the similar or substantially identical continuous light beam (which may be phase-shifted) to the first waveguide;
    a second waveguide coupled or connected to a second one of the n ports of the first m*n optical coupler; and
    a second loop mirror at an end of the second waveguide, configured to return the similar or substantially identical continuous light beam in the second waveguide to the second waveguide,
    wherein the first m*n optical coupler is configured to combine the returned substantially similar or identical continuous light beams from the first and second waveguides to form a modulated optical signal.

2. The optical modulator of claim 1, wherein the first phase shifter and the first waveguide have a curve or arc configured to maintain a phase difference of the first applied electromagnetic field along the first phase shifter of less than $\pi/p$, wherein p is greater than or equal to 2.

3. The optical modulator of claim 1, wherein the first phase shifter comprises a first high-speed phase shifter, and the optical modulator further comprises a first low-speed phase shifter in series with the first high-speed phase shifter.

4. The optical modulator of claim 1, wherein each of the first and second loop mirrors comprises a 1*2 optical coupler and a looped waveguide connected at one end to a first port of the first 1*2 optical coupler and at an opposite end to a second port of the first 1*2 optical coupler.

5. The optical modulator of claim 1, further comprising a second phase shifter coupled to the second waveguide and configured to shift a phase of the substantially similar or identical continuous light beam in the second waveguide in a second applied electromagnetic field, and the second waveguide, second phase shifter and second loop mirror are similar or substantially identical to the first waveguide, first phase shifter and first loop mirror, respectively.

6. The optical modulator of claim 1, wherein the first phase shifter comprises a plurality of sections and the first applied electromagnetic field comprises a corresponding plurality of different radio frequency (RF) electromagnetic field applied to the plurality of sections.

7. The optical modulator of claim 1, wherein the first m*n optical coupler is a 2*2 coupler, the optical modulator further comprises a third waveguide at a second one of the m ports of the first optical coupler, and the first optical coupler is configured to direct, guide or output the modulated optical signal to the third waveguide.

8. The optical modulator of claim 1, wherein the first m*n optical coupler is a second 1*2 optical coupler, the optical modulator further comprises an optical circulator having at least first, second and third ports, the first port is configured to be optically coupled to a source of the continuous light beam, the second port is optically coupled to the first m*n optical coupler, and the optical circulator is configured to (i) direct or guide the continuous light beam from the first port to the second port and (ii) direct or guide the modulated optical signal from the second port to the third port.

9. The optical modulator of claim 1, wherein the first m*n optical coupler, the first and second waveguides, the first phase shifter, and the first and second loop mirrors are on a single photonic chip.

10. The optical modulator of claim 9, wherein the optical waveguides, the phase shifters and the optical couplers on a single photonic chip, and the single photonic chip includes, in sequence:
    a rigid substrate;
    an oxide layer;
    a silicon-on-oxide layer configured to guide and/or manipulate light therein; one or more dielectric layers; and
    a plurality of metal traces in and/or on the one or more dielectric layers.

11. The optical modulator of claim 10, wherein the silicon-on-oxide layer is configured to include (i) one or more sections of the first waveguide therein and (ii) the first phase shifter encompassing or surrounding the one or more sections of the first waveguide, wherein the first waveguide is defined by one or more p-n junctions thereon or at a periphery thereof, and the first phase shifter comprises a doped silicon region adjacent to the first waveguide and connected to first and second regions in the silicon-on-oxide layer that define the first waveguide to change or adjust a voltage across the one or more p-n junctions when the first electromagnetic field is applied.

12. A compound optical modulator, comprising:
    the optical modulator of claim 1, functioning as a first optical modulator unit;
    a second optical modulator unit identical or substantially identical to the first optical modulator unit;
    a first connecting waveguide configured to (i) provide the continuous light beam to the first m*n optical coupler and (ii) receive the modulated optical signal from the first optical modulator unit;
    a second connecting waveguide configured to (i) provide a similar or substantially identical copy of the continuous light beam to a second m*n optical coupler in the second optical modulator unit and (ii) receive a second modulated optical signal from the second optical modulator unit; and
    a third m*n optical coupler configured to receive an output from a continuous light source in a first one of its m ports and output the continuous light beam and a similar or substantially identical copy of the continuous light beam at first and second ones of its n ports.

13. The compound optical modulator of claim 12, wherein the third m*n optical coupler is an m*2 optical coupler that is further configured to receive the first modulated optical signal and the second modulated optical signal in its two n ports and combine the modulated optical signal and the second modulated optical signal to form a compound modulated optical signal, m is 1 or 2, the first optical modulator unit is an in-phase optical modulator, the second optical modulator unit is a quadrature optical modulator, and the compound optical modulator further comprises (i) an in-phase phase shifter coupled to the first connecting waveguide, configured to shift a phase of the continuous light beam and the modulated optical signal in the first connecting waveguide in response to a first stimulus, and (ii) a quadrature phase shifter coupled to the second connecting waveguide, configured to shift a phase of the substantially identical copy of the continuous light beam and the quadrature-modulated optical signal in the second connecting waveguide in response to a second stimulus.

14. The compound optical modulator of claim 12, wherein m is 2 in each of the first and second optical modulator units, each of the first and second optical modulator units further comprises an output waveguide at a second one of the m ports of the m*n optical coupler therein, and the optical modulator further comprises third and fourth low-speed phase shifters respectively coupled to the first and second connecting waveguides and configured to reduce or eliminate reflected light from returning to the laser.

15. The compound optical modulator of claim 14, wherein the third m*n optical coupler is a third 1*2 coupler or a third 2*2 optical coupler.

16. A modulated laser, comprising:
the optical modulator of claim 1; and
a laser configured to emit the continuous light beam.

17. The modulated laser of claim 16, further comprising an optical isolator between the laser and the m*n optical coupler.

18. A method of modulating a continuous light beam, comprising:
receiving the continuous light beam at a first one of m ports of an m*n optical coupler comprising the m ports at a first end thereof and n ports at a second end thereof, wherein m is an integer of one or more and n is an integer of two or more;
outputting similar or substantially identical continuous light beams to first and second waveguides respectively coupled or connected to first and second ones of the n ports of the m*n optical coupler;
selectively applying a first electromagnetic field to shift or not shift a phase of the similar or substantially identical continuous light beam in the first waveguide using a first phase shifter coupled to the first waveguide;
using first and second loop mirrors at respective ends of the first and second waveguides, returning the similar or substantially identical continuous light beam to the first and second waveguides; and
combining the returned similar or substantially identical continuous light beams from the first and second waveguides in the m*n optical coupler to form a modulated optical signal.

19. The method of claim 18, wherein the first phase shifter and the first waveguide have a curve or arc such that the curve or arc of the first phase shifter has a maximum dimension of ¼ of a wavelength of radiation of the first electromagnetic field or less.

20. The method of claim 18, further comprising selectively applying and not applying a second electromagnetic field to respectively shift and not shift a phase of the similar or substantially identical continuous light beam in the second waveguide using a second phase shifter coupled to the second waveguide, wherein applying and not applying the first and second electromagnetic fields respectively corresponds to first and second states of the first and second electromagnetic fields, and the first and second states of the first electromagnetic field are respectively identical or substantially identical to the first and second states of the second electromagnetic field.

* * * * *